US012124807B2

(12) United States Patent
Mayer et al.

(10) Patent No.: US 12,124,807 B2
(45) Date of Patent: Oct. 22, 2024

(54) SEMANTIC MATCHING BETWEEN A SOURCE SCREEN OR SOURCE DATA AND A TARGET SCREEN USING SEMANTIC ARTIFICIAL INTELLIGENCE

(71) Applicant: UiPath, Inc., New York, NY (US)

(72) Inventors: Christian Mayer, Vienna (AT); Mircea Neagovici, Bucharest (RO); Cosmin Voicu, Bucharest (RO); Bogdan Ripa, Bucharest (RO); Ion Miron, Bucharest (RO)

(73) Assignee: UiPath, Inc., New York, NY (US)

( * ) Notice: Subject to any disclaimer, the term of this patent is extended or adjusted under 35 U.S.C. 154(b) by 220 days.

(21) Appl. No.: 18/052,378

(22) Filed: Nov. 3, 2022

(65) Prior Publication Data

US 2023/0112414 A1 Apr. 13, 2023

Related U.S. Application Data

(63) Continuation of application No. 17/494,744, filed on Oct. 5, 2021.

(51) Int. Cl.
*G06F 40/30* (2020.01)
*G06F 3/0481* (2022.01)
(Continued)

(52) U.S. Cl.
CPC ............ *G06F 40/30* (2020.01); *G06F 3/0481* (2013.01); *G06F 40/289* (2020.01); *G06N 20/00* (2019.01);
(Continued)

(58) Field of Classification Search
CPC ...... G06F 40/30; G06F 40/289; G06F 3/0481; G06F 30/20; G06F 17/10; G06F 17/18; G06N 20/00; G06V 30/153; G06V 30/10
See application file for complete search history.

(56) References Cited

U.S. PATENT DOCUMENTS 7,624,353 B2  11/2009  Beumer
10,860,905 B1  12/2020  Gligan et al.
(Continued)

FOREIGN PATENT DOCUMENTS

CN  112231033 A  1/2021
CN  112967132 A  6/2021
(Continued)

OTHER PUBLICATIONS

Extended European Search Report, issued Feb. 8, 2024, European Patent Application No. EP21820901.3.
(Continued)

*Primary Examiner* — Chuen-Meei Gan
(74) *Attorney, Agent, or Firm* — LeonardPatel PC; Michael A. Leonard, II; Sheetal S. Patel

(57) ABSTRACT

Semantic matching between a source screen or source data and a target screen using semantic artificial intelligence (AI) for robotic process automation (RPA) workflows is disclosed. The source data or source screen and the target screen are selected on a matching interface, semantic matching is performed between the source data/screen and the target screen using an artificial intelligence/machine learning (AI/ML) model, and matching graphical elements and unmatched graphical elements are highlighted, allowing the developer to see which graphical elements match and which do not. The matching interface may also provide a confidence score of the individual matches, provide an overall mapping score, and allow the developer to hide/unhide the matched/unmatched graphical elements. Activities of an RPA workflow may be automatically created based on the semantic mapping that can be executed to perform the automation.

28 Claims, 34 Drawing Sheets

(51) Int. Cl.
- *G06F 40/289* (2020.01)
- *G06N 20/00* (2019.01)
- *G06V 30/148* (2022.01)
- G06F 17/10 (2006.01)
- G06F 17/18 (2006.01)
- G06F 30/20 (2020.01)
- G06V 30/10 (2022.01)

(52) U.S. Cl.
CPC .......... *G06V 30/153* (2022.01); *G06F 17/10* (2013.01); *G06F 17/18* (2013.01); *G06F 30/20* (2020.01); *G06V 30/10* (2022.01)

(56) References Cited

U.S. PATENT DOCUMENTS

| | | | |
|---|---|---|---|
| 10,936,351 | B2 | 3/2021 | Voicu |
| 11,200,073 | B1 | 12/2021 | Voicu |
| 2008/0027930 | A1 | 1/2008 | Bohannon et al. |
| 2018/0032626 | A1 | 2/2018 | Ben-Aharon et al. |
| 2019/0213039 | A1 | 7/2019 | Lecue et al. |
| 2019/0213252 | A1* | 7/2019 | Simard .................. G06F 40/30 |
| 2019/0318020 | A1 | 10/2019 | Chauhan et al. |
| 2020/0249964 | A1 | 8/2020 | Fernandes et al. |
| 2020/0366566 | A1 | 11/2020 | Avasarala et al. |
| 2021/0019157 | A1 | 1/2021 | Voicu |
| 2021/0019574 | A1 | 1/2021 | Voicu |
| 2021/0089332 | A1 | 3/2021 | Zohar et al. |
| 2021/0097274 | A1 | 4/2021 | Gligan et al. |
| 2021/0109834 | A1 | 4/2021 | Singh et al. |
| 2021/0294945 | A1 | 9/2021 | Müller et al. |
| 2021/0334470 | A1 | 10/2021 | Molin et al. |
| 2021/0397157 | A1 | 12/2021 | Cote et al. |
| 2022/0011732 | A1 | 1/2022 | Hall |
| 2022/0012024 | A1 | 1/2022 | Grigore |
| 2022/0197674 | A1* | 6/2022 | Ginoya .................. G09G 5/14 |
| 2022/0317978 | A1* | 10/2022 | Barik .................. G06F 8/34 |
| 2023/0182296 | A1 | 6/2023 | Sermanet et al. |

FOREIGN PATENT DOCUMENTS

| | | |
|---|---|---|
| CN | 113435160 A | 9/2021 |
| WO | 2020061700 A1 | 4/2020 |
| WO | 2021055102 A1 | 3/2021 |

OTHER PUBLICATIONS

Chuan Guo et al., "On Calibration of Modern Neural Networks," Proceedings of the 34th International Conference on Machine Learning, PMLR 70:1321-1330 (2017).

International Search Report, issued Jun. 22, 2022, PCT Application No. PCT/US21/57169.

Jitterbit Mapping Mode Page available at https://success.jitterbit.com/display/CS/Mapping+Mode (last updated Oct. 20, 2021).

Jonathan Grandperrin, "How to use confidence scores in machine learning models," available at https://towardsdatascience.com/how-to-use-confidence-scores-in-machine-learning-models-abe9773306fa (Jan. 19, 2021).

Mappings in Informatica Page available at https://www.guru99.com/mappings-informatica.html (Last updated Oct. 7, 2021).

Nils Reimers et al., "Sentence-BERT: Sentence Embeddings using Siamese BERT-Networks," available at https://arxiv.org/pdf/1908.10084.pdf (Aug. 27, 2019).

Pratik Shukla et al., "Main Types of Neural Networks and Their Applications—Tutorial," available at https://pub.towardsai.net/main-types-of-neural-networks-and-its-applications-tutorial-734480d7ec8e (last updated Aug. 15, 2021).

SBERT.net SentenceTransformers Documentation available at https://www.sbert.net/ (last accessed Oct. 4, 2021).

Tony Yiu, "Understanding Neural Networks," available at https://towardsdatascience.com/understanding-neural-networks-19020b758230 (Jun. 2, 2019).

UiPath Object Repository Page available at https://docs.uipath.com/studio/docs/about-object-repository (last accessed Oct. 4, 2021).

K. P. Naveen Reddy et al., "A Study of Robotic Process Automation Among Artificial Intelligence," International Journal of Scientific and Research Publications, vol. 9, Issue 2 (Feb. 2019).

Kaushik Chakrabarti et al., "TableQnA: Answering ListIntent Queries With Web Tables," available at https://arxiv.org/pdf/2001.04828 (Jan. 10, 2020).

Tom Taulli, "Robotic Process Automation (RPA) An Easier Path to AI," chapter 5, available at https://link.springer.com/chapter/10.1007/978-1-4842-5028-0_5 (2019).

European Search Report issued in European Application No. 22199898.2 on Feb. 8, 2023.

Giunchiglia et al., "Semantic Matching," The Knowledge Engineering Review, Cambridge University Press, vol. 18, No. 3, pp. 265-280 (Sep. 1, 2003).

Lasker et al., "Semi-Supervised Semantic Matching," Pattern Recognition : 5ht Asian Conference, ACPR, Auckland, New Zealand, Nov. 26-29, 2019, LNCS 11131, pp. 444-455 (Jan. 23, 2019).

Chakrabarti, et al., "TableQnA: Answering List Intent Queries with Web Tables", arXiv preprint arXiv:2001.04828. Jan. 10, 2020. (Year: 2020).

Chuen-Meei Gan, "Notice of Allowance", issued Aug. 21, 2024, U.S. Appl. No. 17/494,744.

Reddy, et al. "A Study of Robotic Process Automation Among Artificial Intelligence", International Journal of Scientific and Research Publications. Feb. 2019;9(2):392-7. (Year: 2019).

Taulli, Tom, "Robotic Process Automation (RPA) An Easier Path to AI. Artificial Intelligence Basics: A Non-Technical Introduction", 2019:91-102. (Year: 2019).

Nga B Nguyen, "Non-Final Office Action", issued Aug. 27, 2024, U.S. Appl. No. 17/746,855.

* cited by examiner

Web Browser https://www.examplecompany.com/invoice_page.html

Invoice Number: 1234
Invoice Amount: 1299.93
Currency: USD
Bill To: John Smith
Invoice Date: 9/27/2021
Address: 123 Main Street
Due Date: 10/27/2021
City: Saskatoon
State/Province: Saskatchewan
Postal Code: S0K 0Y0
Country: Canada Submit

1123

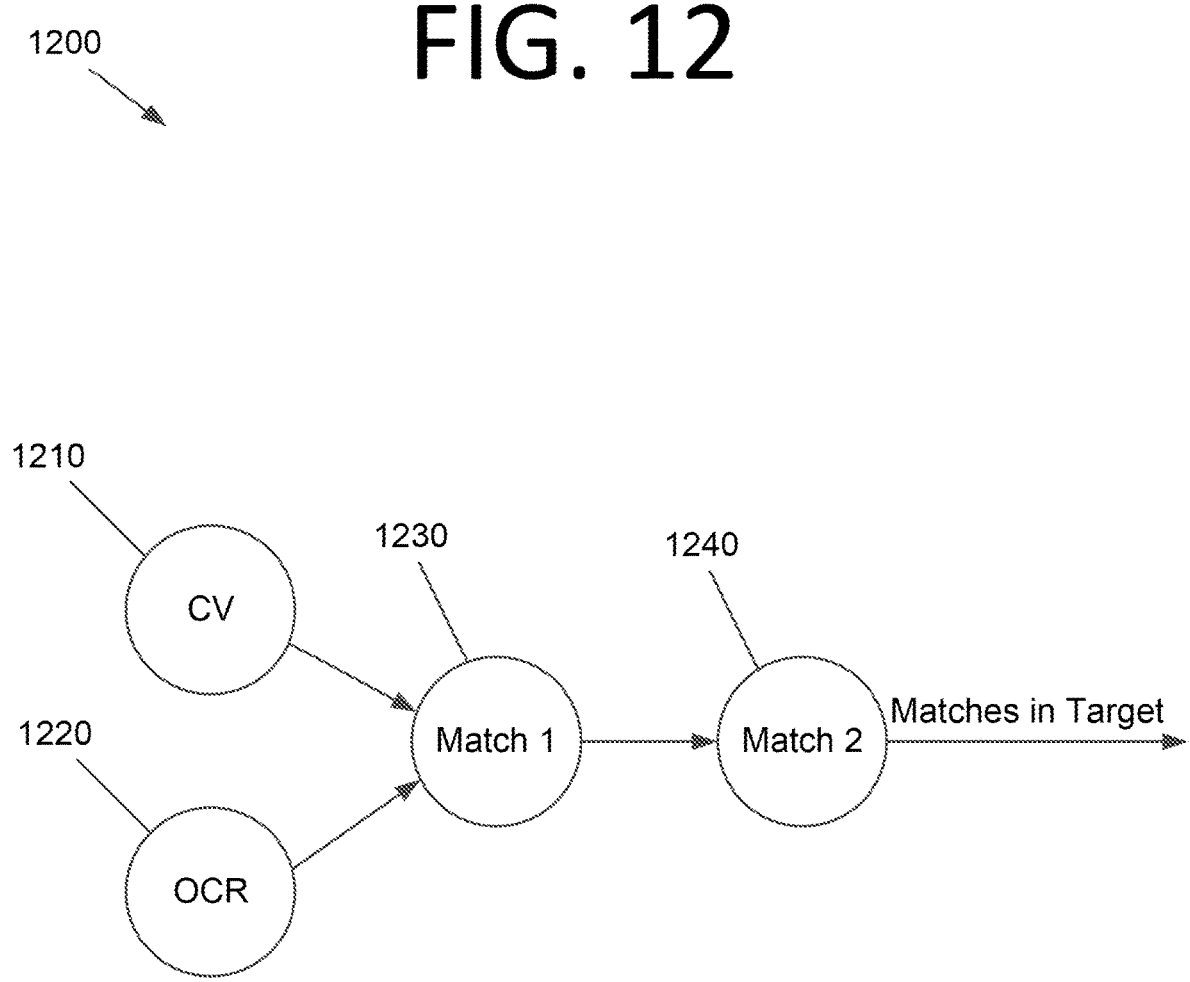

SEMANTIC MATCHING BETWEEN A SOURCE SCREEN OR SOURCE DATA AND A TARGET SCREEN USING SEMANTIC ARTIFICIAL INTELLIGENCE

CROSS-REFERENCE TO RELATED APPLICATION

This application is a continuation of, and claims priority to, U.S. patent application Ser. No. 17/494,744 filed on Oct. 5, 2021. The subject matter thereof is hereby incorporated herein by reference in its entirety.

FIELD

The present invention generally relates to semantic matching, and more specifically, to semantic matching between a source screen or source data and a target screen using semantic artificial intelligence (AI) for robotic process automation (RPA) workflows.

BACKGROUND

Currently, developers need to manually create robotic process automation (RPA) workflows in an RPA designer application using activities. While creating the RPA workflow, the developer needs to indicate the target graphical element on the screen, which causes the RPA designer application to automatically generate a selector corresponding to the target element with a set of anchors. Although activity recommendation and suggestion functionality currently exists in UiPath Studio™, for example, fully automated RPA workflow creation is not supported. Indicating all of the target graphical elements manually while creating the RPA workflow is time consuming. Accordingly, an improved approach to creating RPA workflows may be beneficial.

SUMMARY

Certain embodiments of the present invention may provide solutions to the problems and needs in the art that have not yet been fully identified, appreciated, or solved by current RPA workflow generation technologies. For example, some embodiments of the present invention pertain to semantic matching between a source screen or source data and a target screen using semantic AI for RPA workflows.

In an embodiment, a non-transitory computer-readable medium stores a computer program. The computer program is configured to cause at least one processor to receive a selection of a source screen or source data and receive a selection of a target screen. The computer program is also configured to cause the at least one processor to call one or more AI/ML models that have been trained to perform semantic matching between labels in the source screen and labels in the target screen, between data elements in the source data and the labels in the target screen, or both. The computer program is further configured to cause the at least one processor to receive indications of graphical elements associated with semantically matched labels in the target screen and respective confidence scores from the one or more AI/ML models and display the graphical elements associated with the semantically matched labels on the target screen in a matching interface.

In another embodiment, a computer-implemented method for performing semantic AI for RPA includes calling, by an RPA designer application, one or more AI/ML models that have been trained to perform semantic matching between labels in a source screen and labels in a target screen, between data elements in the source data and the labels in the target screen, or both. The computer-implemented method also includes receiving, by the RPA designer application, indications of graphical elements associated with semantically matched labels in the target screen and respective confidence scores from the one or more AI/ML models and displaying the graphical elements associated with the semantically matched labels on the target screen in a matching interface, by the RPA designer application. The computer-implemented method further includes automatically generating one or more activities in an RPA workflow that copy data from fields of the source screen or the data elements of the source data into fields of the target screen having labels that the one or more AI/ML models identified as semantically matching the labels from the source screen or the data elements from the source data, by the RPA designer application.

In yet another embodiment, a computing system includes memory storing computer program instructions for performing semantic AI for RPA and at least one processor configured to execute the computer program instructions. The computer program instructions are configured to cause the at least one processor to receive indications of graphical elements associated with semantically matched labels in a target screen and respective confidence scores from one or more AI/ML models that have been trained to perform semantic matching between labels in the source screen and labels in the target screen, between data elements in the source data and the labels in the target screen, or both. The computer program instructions are also configured to cause the at least one processor to display the graphical elements associated with the semantically matched labels on the target screen in a matching interface. The computer program instructions are further configured to cause the at least one processor to receive a correction to a graphical element in the target screen identified by the one or more AI/ML models as having an associated semantically matching label, receive an indication of a new element in the target screen that was not semantically matched to a label in the source screen by the one or more AI/ML models, or both. Additionally, the computer program instructions are configured to cause the at least one processor to collect information pertaining to the corrected and/or newly labeled graphical element in the target screen and the associated label and directly or indirectly store the collected information for retraining of the one or more AI/ML models.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 12 is an architectural diagram illustrating an architecture of the AI/ML models for performing semantic AI, according to an embodiment of the present invention.

Unless otherwise indicated, similar reference characters denote corresponding features consistently throughout the attached drawings.

DETAILED DESCRIPTION OF THE EMBODIMENTS

Figure 1:
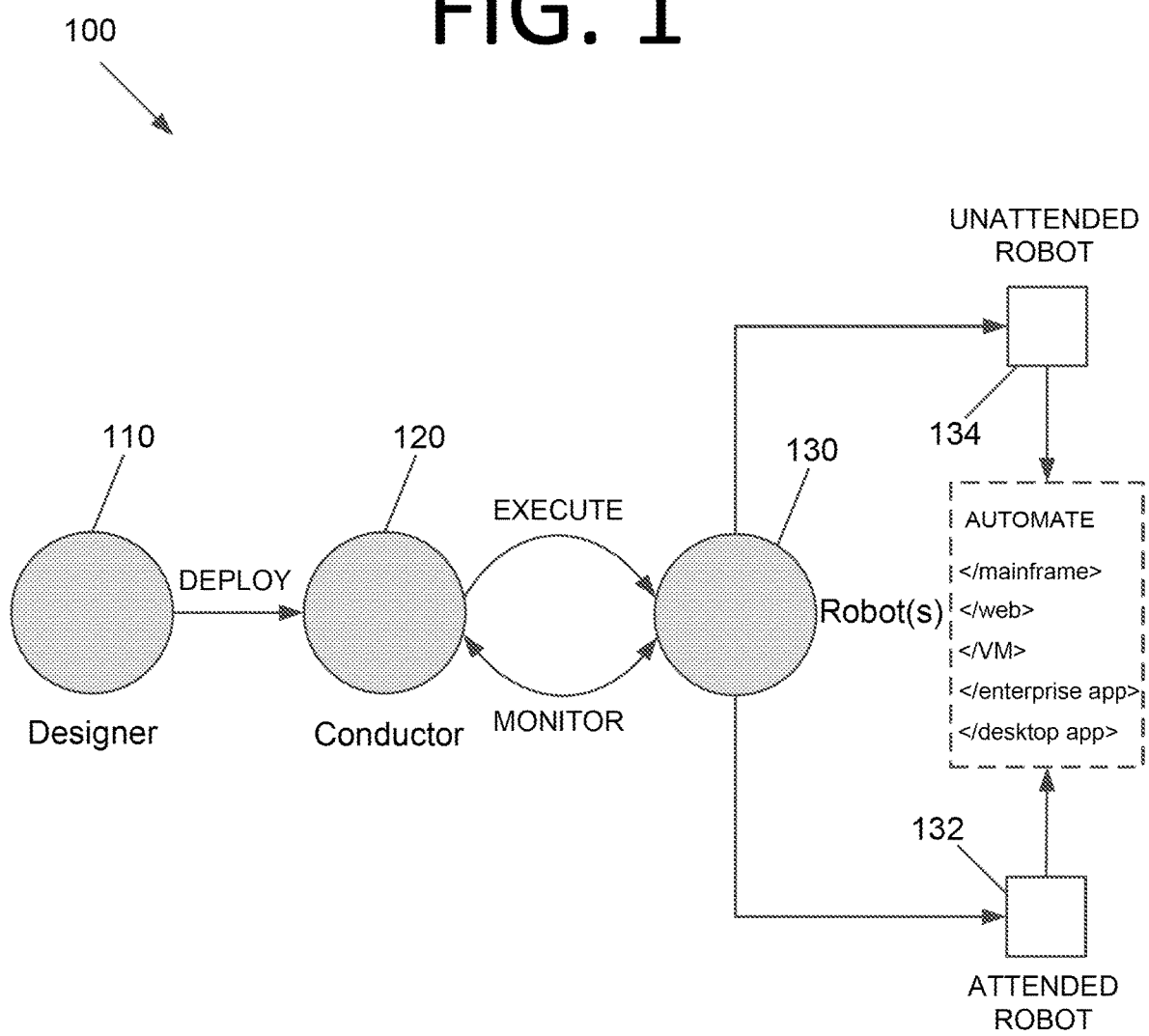
FIG. 1 is an architectural diagram illustrating an RPA system, according to an embodiment of the present invention.

Some embodiments pertain to semantic matching between a source screen or source data and a target screen using semantic AI for RPA workflows. For instance, in some embodiments, the source data or source screen and the target screen are selected on a matching interface, semantic matching is performed between the source data/screen and the target screen using an artificial intelligence/machine learning (AI/ML) model, and matching graphical elements and unmatched graphical elements are highlighted using different colors (e.g., green and red, respectively), allowing the developer to see which graphical elements match and which do not. The matching interface also has additional features in some embodiments, such as providing a confidence score of the individual matches, providing an overall mapping score, and allowing the developer to hide/unhide the matched/unmatched graphical elements. Further, one or more RPA workflow activities are automatically created in some embodiments based on the semantic mapping that can be executed to perform the semantic AI functionality as part of an automation executed by an RPA robot.

In some embodiments, a list of data fields may be obtained, such as from an Excel® spreadsheet, a relational database, a flat file source, etc. The semantic matching AI/ML model may iterate over the entries in the data and fill them into the target screen. The semantic matching AI/ML model may be trained to do this regardless of the type of the data source. Due to the semantic matching functionality of this AI/ML model, a 1-to-1 matching may not be required. For instance, a natural language model may seek to match identical or similar names/phrases in a target screen to those in the source data (or start with the source data and look for similar names/phrases in the target screen). In certain embodiments, an extensive set of training data is used to make the semantic matching AI/ML model more accurate since there may be many similar words or phrases for certain terms and there may also be many different subsets depending on context. In some embodiments, context may also be used. For instance, the semantic matching AI/ML model may learn that a given target pertains to banking details vs. an invoice, vs. a purchase order vs. contact information, etc.

The semantic matching AI/ML model of some embodiments may be deployed to assist RPA developers during design time. However, in some embodiments, the semantic matching AI/ML model may be used at runtime to provide more robust functionality and self-healing. This may be employed if the UI descriptor fails to identify the target graphical element at runtime rather than generally in some embodiments since UI descriptors tend to be considerably faster than semantic matching AI/ML models. As such, UI descriptors should be employed first for the same or similar target screens.

For instance, if a given target element cannot be identified by a given user interface (UI) descriptor at runtime, such as if a UI changes due to a new version of a target application, the semantic matching AI/ML model may be used to attempt to identify the target graphical element. This information may then be added as a synonym for the word or phrase of interest, and the UI descriptor for that graphical element may be updated such that the UI descriptor will work going forward. If the user interface changes yet again and the changed graphical element and/or anchor(s) are similar enough, the RPA robot may be able to identify the target graphical element in the new version of the application. See U.S. patent application Publication Ser. No. 16/922,289, for example.

A UI descriptor is a set of instructions for finding a UI element. UI descriptors in some embodiments are an encapsulated data/struct format that includes UI element selector(s), anchor selector(s), computer vision (CV) descriptor(s), unified target descriptor(s), a screen image capture (context), an element image capture, other metadata (e.g., the application and application version), a combination thereof, etc. The encapsulated data/struct format may be extensible with future updates to the platform and is not limited to the above definition. Any suitable UI descriptor for identifying a UI element on a screen may be used without deviating from the scope of the invention.

In some embodiments, what the semantic matching AI/ML model is detecting may be combined with unified target descriptors for runtime detection. For such embodiments, in addition to words and phrases for the source and target, once mappings are confirmed, unified target information may be collected. At runtime, the unified target descriptor may be tried first, and if not successful, the semantic matching AI/ML model may be used.

Unified target descriptors tend to be more stable and accurate than AI/ML models. A unified target descriptor chains together multiple types of UI descriptors. Unified target information includes UI descriptor information that facilitates identification of graphical elements for the UI descriptor(s) that are employed.

A unified target descriptor may function like a finite state machine (FSM), where in a first context, a first UI descriptor mechanism is applied, in a second context, a second UI descriptor is applied, etc. In other words, the UI descriptors may work with a unified target that encompasses some or all UI detection mechanisms through which image detection and definition are performed in some embodiments. The unified target may merge multiple techniques of identifying and automating UI elements into a single cohesive approach. The unified target may prioritize certain UI descriptor types in some embodiments, such as prioritizing selector-based and driver-based UI detection mechanisms and using CV as a fallback to find a target UI element if the first two mechanisms are not successful.

In some embodiments, a natural language processing (NLP) AI/ML model may be used in addition to or in lieu of a semantic matching AI/ML model. In certain embodiments, these AI/ML models may be used together. For instance, if one of the models meets or exceeds a certain threshold, if the average of both of the models meets or exceeds a threshold, etc., a match may be proposed to the user.

In some embodiments, feedback loop functionality is provided. For instance, if a user adds a match or corrects a match proposed by the semantic matching AI/ML model, information pertaining to this match may be saved. This information may include, but is not limited to, a screenshot of the target application, the label in the target application and the corresponding label in the source screen or source data, the label of the incorrect match, etc. The context may also be captured, such as that the correction occurred for a webpage, SAP®, etc. This data may be used in conjunction with other labeled data collected in this manner to retrain the semantic matching AI/ML model.

FIG. 1 is an architectural diagram illustrating an RPA system 100, according to an embodiment of the present invention. RPA system 100 includes a designer 110 that allows a developer to design and implement workflows. Designer 110 may provide a solution for application integration, as well as automating third-party applications, administrative Information Technology (IT) tasks, and business IT processes. Designer 110 may facilitate development of an automation project, which is a graphical representation of a business process. Simply put, designer 110 facilitates the development and deployment of workflows and robots.

The automation project enables automation of rule-based processes by giving the developer control of the execution order and the relationship between a custom set of steps developed in a workflow, defined herein as "activities." One commercial example of an embodiment of designer 110 is UiPath Studio™. Each activity may include an action, such as clicking a button, reading a file, writing to a log panel, etc. In some embodiments, workflows may be nested or embedded.

Some types of workflows may include, but are not limited to, sequences, flowcharts, Finite State Machines (FSMs), and/or global exception handlers. Sequences may be particularly suitable for linear processes, enabling flow from one activity to another without cluttering a workflow. Flowcharts may be particularly suitable to more complex business logic, enabling integration of decisions and connection of activities in a more diverse manner through multiple branching logic operators. FSMs may be particularly suitable for large workflows. FSMs may use a finite number of states in their execution, which are triggered by a condition (i.e., transition) or an activity. Global exception handlers may be particularly suitable for determining workflow behavior when encountering an execution error and for debugging processes.

Once a workflow is developed in designer 110, execution of business processes is orchestrated by conductor 120, which orchestrates one or more robots 130 that execute the workflows developed in designer 110. One commercial example of an embodiment of conductor 120 is UiPath Orchestrator™. Conductor 120 facilitates management of the creation, monitoring, and deployment of resources in an environment. Conductor 120 may act as an integration point with third-party solutions and applications.

Conductor 120 may manage a fleet of robots 130, connecting and executing robots 130 from a centralized point. Types of robots 130 that may be managed include, but are not limited to, attended robots 132, unattended robots 134, development robots (similar to unattended robots 134, but used for development and testing purposes), and nonproduction robots (similar to attended robots 132, but used for development and testing purposes). Attended robots 132 are triggered by user events and operate alongside a human on the same computing system. Attended robots 132 may be used with conductor 120 for a centralized process deployment and logging medium. Attended robots 132 may help the human user accomplish various tasks, and may be triggered by user events. In some embodiments, processes cannot be started from conductor 120 on this type of robot and/or they cannot run under a locked screen. In certain embodiments, attended robots 132 can only be started from a robot tray or from a command prompt. Attended robots 132 should run under human supervision in some embodiments.

Unattended robots 134 run unattended in virtual environments and can automate many processes. Unattended robots 134 may be responsible for remote execution, monitoring, scheduling, and providing support for work queues. Debugging for all robot types may be run in designer 110 in some embodiments. Both attended and unattended robots may automate various systems and applications including, but not limited to, mainframes, web applications, VMs, enterprise applications (e.g., those produced by SAP®, SalesForce®, Oracle®, etc.), and computing system applications (e.g., desktop and laptop applications, mobile device applications, wearable computer applications, etc.).

Conductor 120 may have various capabilities including, but not limited to, provisioning, deployment, configuration, queueing, monitoring, logging, and/or providing interconnectivity. Provisioning may include creating and maintenance of connections between robots 130 and conductor 120 (e.g., a web application). Deployment may include assuring the correct delivery of package versions to assigned robots 130 for execution. Configuration may include maintenance and delivery of robot environments and process configurations. Queueing may include providing management of queues and queue items. Monitoring may include keeping track of robot identification data and maintaining user permissions. Logging may include storing and indexing logs to a database (e.g., an SQL database) and/or another storage mechanism (e.g., ElasticSearch®, which provides the ability to store and quickly query large datasets). Conductor 120 may provide interconnectivity by acting as the centralized point of communication for third-party solutions and/or applications.

Robots 130 are execution agents that run workflows built in designer 110. One commercial example of some embodiments of robot(s) 130 is UiPath Robots™. In some embodiments, robots 130 install the Microsoft Windows® Service Control Manager (SCM)—managed service by default. As a result, such robots 130 can open interactive Windows® sessions under the local system account, and have the rights of a Windows® service.

In some embodiments, robots 130 can be installed in a user mode. For such robots 130, this means they have the same rights as the user under which a given robot 130 has been installed. This feature may also be available for High Density (HD) robots, which ensure full utilization of each machine at its maximum potential. In some embodiments, any type of robot 130 may be configured in an HD environment.

Robots 130 in some embodiments are split into several components, each being dedicated to a particular automation task. The robot components in some embodiments include, but are not limited to, SCM-managed robot services, user mode robot services, executors, agents, and command line. SCM-managed robot services manage and monitor Windows® sessions and act as a proxy between conductor 120 and the execution hosts (i.e., the computing systems on which robots 130 are executed). These services are trusted with and manage the credentials for robots 130. A console application is launched by the SCM under the local system.

User mode robot services in some embodiments manage and monitor Windows® sessions and act as a proxy between conductor 120 and the execution hosts. User mode robot services may be trusted with and manage the credentials for robots 130. A Windows® application may automatically be launched if the SCM-managed robot service is not installed.

Executors may run given jobs under a Windows® session (i.e., they may execute workflows. Executors may be aware of per-monitor dots per inch (DPI) settings. Agents may be Windows® Presentation Foundation (WPF) applications that display the available jobs in the system tray window. Agents may be a client of the service. Agents may request to start or stop jobs and change settings. The command line is a client of the service. The command line is a console application that can request to start jobs and waits for their output.

Having components of robots 130 split as explained above helps developers, support users, and computing systems more easily run, identify, and track what each component is executing. Special behaviors may be configured per component this way, such as setting up different firewall rules for the executor and the service. The executor may always be aware of DPI settings per monitor in some embodiments. As a result, workflows may be executed at any DPI, regardless of the configuration of the computing system on which they were created. Projects from designer 110 may also be independent of browser zoom level in some embodiments. For applications that are DPI-unaware or intentionally marked as unaware, DPI may be disabled in some embodiments.

Figure 2:
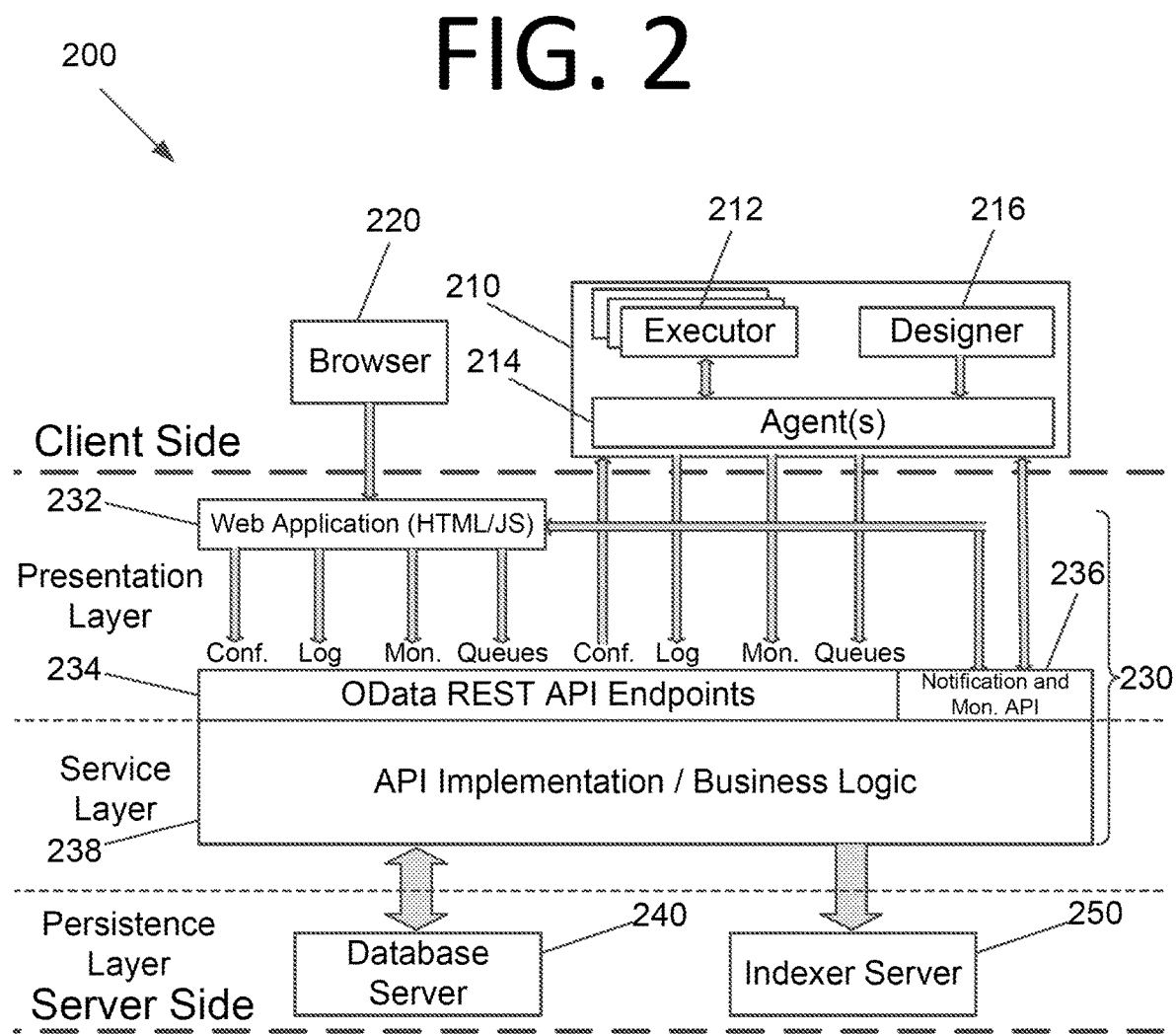
FIG. 2 is an architectural diagram illustrating a deployed RPA system, according to an embodiment of the present invention.

FIG. 2 is an architectural diagram illustrating a deployed RPA system 200, according to an embodiment of the present invention. In some embodiments, RPA system 200 may be, or may be a part of, RPA system 100 of FIG. 1. It should be noted that the client side, the server side, or both, may include any desired number of computing systems without deviating from the scope of the invention. On the client side, a robot application 210 includes executors 212, an agent 214, and a designer 216. However, in some embodiments, designer 216 may not be running on computing system 210. Executors 212 are running processes. Several business projects may run simultaneously, as shown in FIG. 2. Agent 214 (e.g., a Windows® service) is the single point of contact for all executors 212 in this embodiment. All messages in this embodiment are logged into conductor 230, which processes them further via database server 240, indexer server 250, or both. As discussed above with respect to FIG. 1, executors 212 may be robot components.

In some embodiments, a robot represents an association between a machine name and a username. The robot may manage multiple executors at the same time. On computing systems that support multiple interactive sessions running simultaneously (e.g., Windows® Server 2012), multiple robots may be running at the same time, each in a separate Windows® session using a unique username. This is referred to as HD robots above.

Agent 214 is also responsible for sending the status of the robot (e.g., periodically sending a "heartbeat" message indicating that the robot is still functioning) and downloading the required version of the package to be executed. The communication between agent 214 and conductor 230 is always initiated by agent 214 in some embodiments. In the notification scenario, agent 214 may open a WebSocket channel that is later used by conductor 230 to send commands to the robot (e.g., start, stop, etc.).

On the server side, a presentation layer (web application 232, Open Data Protocol (OData) Representative State Transfer (REST) Application Programming Interface (API) endpoints 234, and notification and monitoring 236), a service layer (API implementation/business logic 238), and a persistence layer (database server 240 and indexer server 250) are included. Conductor 230 includes web application 232, OData REST API endpoints 234, notification and monitoring 236, and API implementation/business logic 238. In some embodiments, most actions that a user performs in the interface of conductor 230 (e.g., via browser 220) are performed by calling various APIs. Such actions may include, but are not limited to, starting jobs on robots, adding/removing data in queues, scheduling jobs to run unattended, etc. without deviating from the scope of the invention. Web application 232 is the visual layer of the server platform. In this embodiment, web application 232 uses Hypertext Markup Language (HTML) and JavaScript (JS). However, any desired markup languages, script languages, or any other formats may be used without deviating from the scope of the invention. The user interacts with web pages from web application 232 via browser 220 in this embodiment in order to perform various actions to control conductor 230. For instance, the user may create robot groups, assign packages to the robots, analyze logs per robot and/or per process, start and stop robots, etc.

In addition to web application 232, conductor 230 also includes service layer that exposes OData REST API endpoints 234. However, other endpoints may be included without deviating from the scope of the invention. The REST API is consumed by both web application 232 and agent 214. Agent 214 is the supervisor of one or more robots on the client computer in this embodiment.

The REST API in this embodiment covers configuration, logging, monitoring, and queueing functionality. The configuration endpoints may be used to define and configure application users, permissions, robots, assets, releases, and environments in some embodiments. Logging REST endpoints may be used to log different information, such as errors, explicit messages sent by the robots, and other environment-specific information, for instance. Deployment REST endpoints may be used by the robots to query the package version that should be executed if the start job command is used in conductor 230. Queueing REST endpoints may be responsible for queues and queue item management, such as adding data to a queue, obtaining a transaction from the queue, setting the status of a transaction, etc.

Monitoring REST endpoints may monitor web application 232 and agent 214. Notification and monitoring API 236 may be REST endpoints that are used for registering agent 214, delivering configuration settings to agent 214, and for sending/receiving notifications from the server and agent 214. Notification and monitoring API 236 may also use WebSocket communication in some embodiments.

The persistence layer includes a pair of servers in this embodiment—database server 240 (e.g., a SQL server) and indexer server 250. Database server 240 in this embodiment stores the configurations of the robots, robot groups, associated processes, users, roles, schedules, etc. This information is managed through web application 232 in some embodiments. Database server 240 may manage queues and queue items. In some embodiments, database server 240 may store messages logged by the robots (in addition to or in lieu of indexer server 250).

Indexer server 250, which is optional in some embodiments, stores and indexes the information logged by the robots. In certain embodiments, indexer server 250 may be disabled through configuration settings. In some embodiments, indexer server 250 uses ElasticSearch®, which is an open source project full-text search engine. Messages logged by robots (e.g., using activities like log message or write line) may be sent through the logging REST endpoint(s) to indexer server 250, where they are indexed for future utilization.

Figure 3:
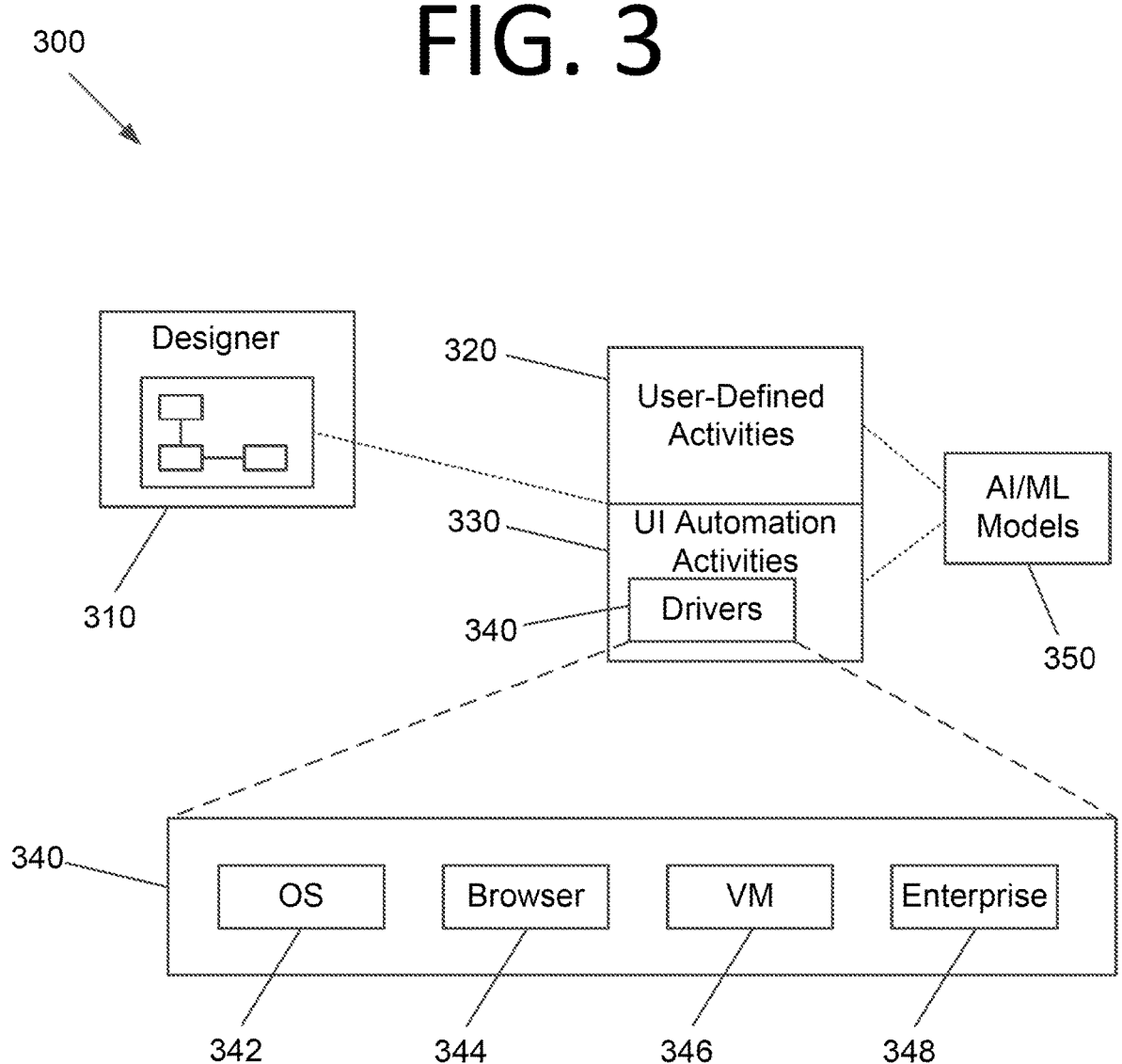
FIG. 3 is an architectural diagram illustrating the relationship between a designer, activities, and drivers, according to an embodiment of the present invention.

FIG. 3 is an architectural diagram illustrating the relationship 300 between a designer 310, activities 320, 330, drivers 340, and AI/ML models 350, according to an embodiment of the present invention. Per the above, a developer uses designer 310 to develop workflows that are executed by robots. Workflows may include user-defined activities 320 and UI automation activities 330. User-defined activities 320 and/or UI automation activities 330 may call one or more AI/ML models 350 in some embodiments, which may be located locally to the computing system on which the robot is operating and/or remotely thereto. Some embodiments are able to identify non-textual visual components in an image, which is called computer vision (CV) herein. Some CV activities pertaining to such components may include, but are not limited to, click, type, get text, hover, element exists, refresh scope, highlight, etc. Click in some embodiments identifies an element using CV, optical character recognition (OCR), fuzzy text matching, and multi-anchor, for example, and clicks it. Type may identify an element using the above and types in the element. Get text may identify the location of specific text and scan it using OCR. Hover may identify an element and hover over it. Element exists may check whether an element exists on the screen using the techniques described above. In some embodiments, there may be hundreds or even thousands of activities that can be implemented in designer 310. However, any number and/or type of activities may be available without deviating from the scope of the invention.

UI automation activities 330 are a subset of special, lower level activities that are written in lower level code (e.g., CV activities) and facilitate interactions with the screen. UI automation activities 330 facilitate these interactions via drivers 340 and/or AI/ML models 350 that allow the robot to interact with the desired software. For instance, drivers 340 may include OS drivers 342, browser drivers 344, VM drivers 346, enterprise application drivers 348, etc. One or more of AI/ML models 350 may be used by UI automation activities 330 in order to determine perform interactions with the computing system. In some embodiments, AI/ML models 350 may augment drivers 340 or replace them completely. Indeed, in certain embodiments, drivers 340 are not included.

Drivers 340 may interact with the OS at a low level looking for hooks, monitoring for keys, etc. They may facilitate integration with Chrome®, IE®, Citrix®, SAP®, etc. For instance, the "click" activity performs the same role in these different applications via drivers 340.

Figure 4:
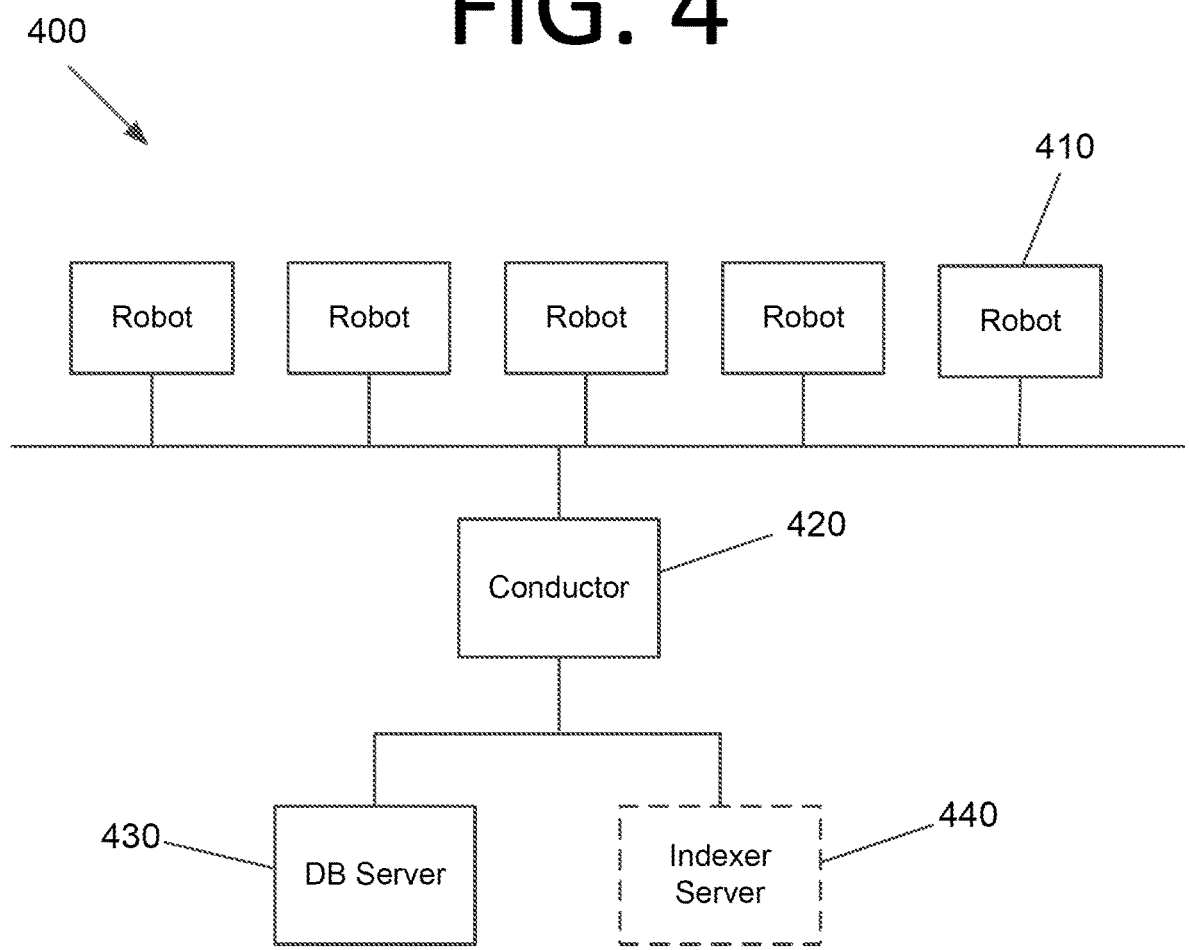
FIG. 4 is an architectural diagram illustrating an RPA system, according to an embodiment of the present invention.

FIG. 4 is an architectural diagram illustrating an RPA system 400, according to an embodiment of the present invention. In some embodiments, RPA system 400 may be or include RPA systems 100 and/or 200 of FIGS. 1 and/or 2. RPA system 400 includes multiple client computing systems 410 running robots. Computing systems 410 are able to communicate with a conductor computing system 420 via a web application running thereon. Conductor computing system 420, in turn, is able to communicate with a database server 430 and an optional indexer server 440.

With respect to FIGS. 1 and 3, it should be noted that while a web application is used in these embodiments, any suitable client/server software may be used without deviating from the scope of the invention. For instance, the conductor may run a server-side application that communicates with non-web-based client software applications on the client computing systems.

Figure 5:
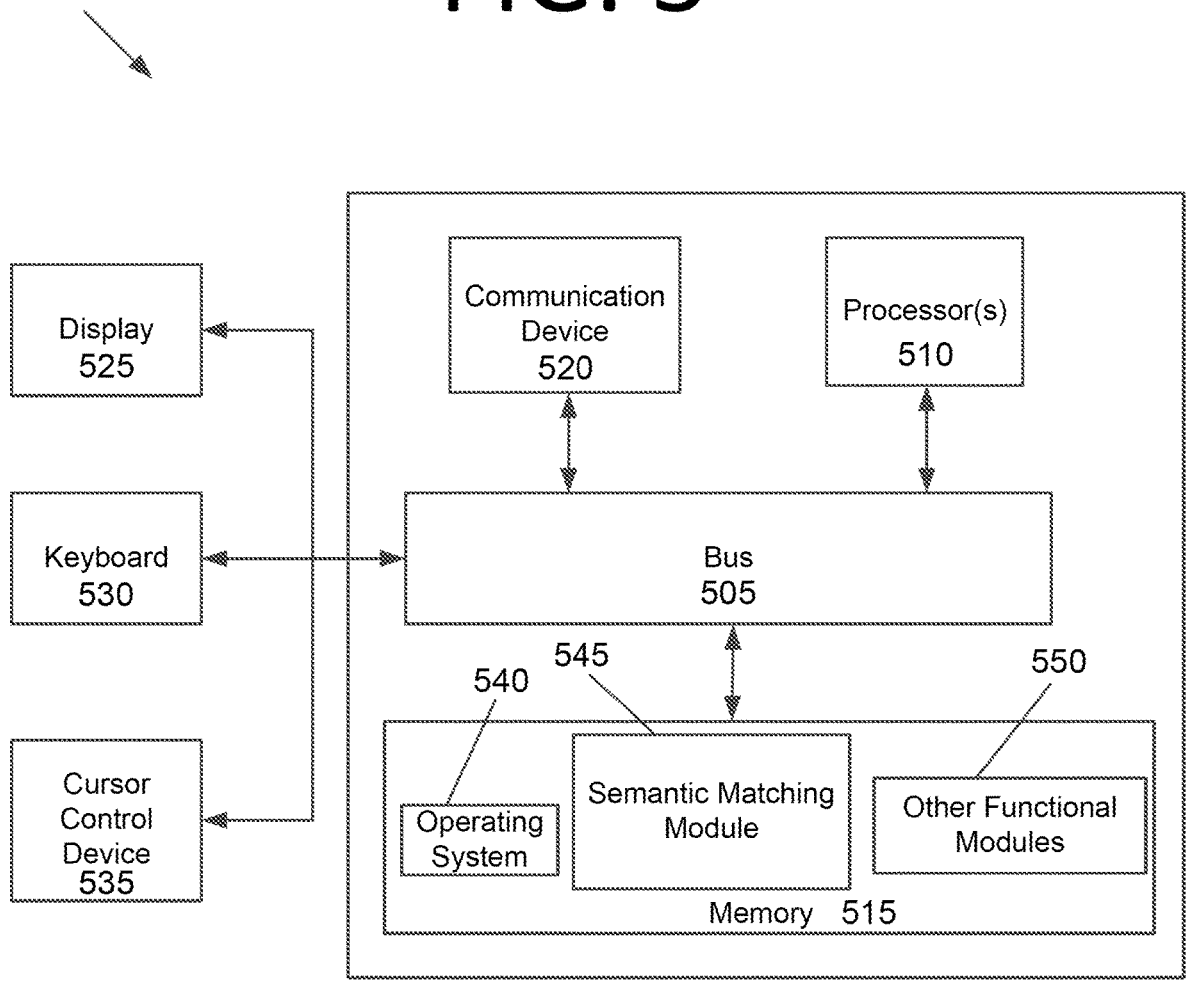
FIG. 5 is an architectural diagram illustrating a computing system configured to perform semantic matching between a source screen or source data and a target screen using semantic AI for RPA workflows, according to an embodiment of the present invention.

FIG. 5 is an architectural diagram illustrating a computing system 500 configured to perform semantic matching between a source screen/source data and a target screen using semantic AI for RPA workflows, according to an embodiment of the present invention. In some embodiments, computing system 500 may be one or more of the computing systems depicted and/or described herein. Computing system 500 includes a bus 505 or other communication mechanism for communicating information, and processor(s) 510 coupled to bus 505 for processing information. Processor(s) 510 may be any type of general or specific purpose processor, including a Central Processing Unit (CPU), an Application Specific Integrated Circuit (ASIC), a Field Programmable Gate Array (FPGA), a Graphics Processing Unit (GPU), multiple instances thereof, and/or any combination thereof. Processor(s) 510 may also have multiple processing cores, and at least some of the cores may be configured to perform specific functions. Multi-parallel processing may be used in some embodiments. In certain embodiments, at least one of processor(s) 510 may be a neuromorphic circuit that includes processing elements that mimic biological neurons. In some embodiments, neuromorphic circuits may not require the typical components of a Von Neumann computing architecture.

Computing system 500 further includes a memory 515 for storing information and instructions to be executed by processor(s) 510. Memory 515 can be comprised of any combination of Random Access Memory (RAM), Read Only Memory (ROM), flash memory, cache, static storage such as a magnetic or optical disk, or any other types of non-transitory computer-readable media or combinations thereof. Non-transitory computer-readable media may be any available media that can be accessed by processor(s) 510 and may include volatile media, non-volatile media, or both. The media may also be removable, non-removable, or both.

Additionally, computing system 500 includes a communication device 520, such as a transceiver, to provide access to a communications network via a wireless and/or wired connection. In some embodiments, communication device 520 may be configured to use Frequency Division Multiple Access (FDMA), Single Carrier FDMA (SC-FDMA), Time Division Multiple Access (TDMA), Code Division Multiple Access (CDMA), Orthogonal Frequency Division Multiplexing (OFDM), Orthogonal Frequency Division Multiple Access (OFDMA), Global System for Mobile (GSM) communications, General Packet Radio Service (GPRS), Universal Mobile Telecommunications System (UMTS), cdma2000, Wideband CDMA (W-CDMA), High-Speed Downlink Packet Access (HSDPA), High-Speed Uplink Packet Access (HSUPA), High-Speed Packet Access (HSPA), Long Term Evolution (LTE), LTE Advanced (LTE-A), 802.11x, Wi-Fi, Zigbee, Ultra-WideBand (UWB), 802.16x, 802.15, Home Node-B (HnB), Bluetooth, Radio Frequency Identification (RFID), Infrared Data Association (IrDA), Near-Field Communications (NFC), fifth generation (5G), New Radio (NR), any combination thereof, and/or any other currently existing or future-implemented communications standard and/or protocol without deviating from the scope of the invention. In some embodiments, communication device 520 may include one or more antennas that are singular, arrayed, phased, switched, beamforming, beamsteering, a combination thereof, and or any other antenna configuration without deviating from the scope of the invention.

Processor(s) 510 are further coupled via bus 505 to a display 525, such as a plasma display, a Liquid Crystal Display (LCD), a Light Emitting Diode (LED) display, a Field Emission Display (FED), an Organic Light Emitting Diode (OLED) display, a flexible OLED display, a flexible substrate display, a projection display, a 4K display, a high definition display, a Retina® display, an In-Plane Switching (IPS) display, or any other suitable display for displaying information to a user. Display 525 may be configured as a touch (haptic) display, a three dimensional (3D) touch display, a multi-input touch display, a multi-touch display, etc. using resistive, capacitive, surface-acoustic wave (SAW) capacitive, infrared, optical imaging, dispersive signal technology, acoustic pulse recognition, frustrated total internal reflection, etc. Any suitable display device and haptic I/O may be used without deviating from the scope of the invention.

A keyboard 530 and a cursor control device 535, such as a computer mouse, a touchpad, etc., are further coupled to bus 505 to enable a user to interface with computing system 500. However, in certain embodiments, a physical keyboard and mouse may not be present, and the user may interact with the device solely through display 525 and/or a touchpad (not shown). Any type and combination of input devices may be used as a matter of design choice. In certain embodiments, no physical input device and/or display is present. For instance, the user may interact with computing system 500 remotely via another computing system in communication therewith, or computing system 500 may operate autonomously.

Memory 515 stores software modules that provide functionality when executed by processor(s) 510. The modules include an operating system 540 for computing system 500. The modules further include a semantic matching module 545 that is configured to perform all or part of the processes described herein or derivatives thereof. Computing system 500 may include one or more additional functional modules 550 that include additional functionality.

One skilled in the art will appreciate that a "system" could be embodied as a server, an embedded computing system, a personal computer, a console, a personal digital assistant (PDA), a cell phone, a tablet computing device, a quantum computing system, or any other suitable computing device, or combination of devices without deviating from the scope of the invention. Presenting the above-described functions as being performed by a "system" is not intended to limit the scope of the present invention in any way, but is intended to provide one example of the many embodiments of the present invention. Indeed, methods, systems, and apparatuses disclosed herein may be implemented in localized and distributed forms consistent with computing technology, including cloud computing systems. The computing system could be part of or otherwise accessible by a local area network (LAN), a mobile communications network, a satellite communications network, the Internet, a public or private cloud, a hybrid cloud, a server farm, any combination thereof, etc. Any localized or distributed architecture may be used without deviating from the scope of the invention.

It should be noted that some of the system features described in this specification have been presented as modules, in order to more particularly emphasize their implementation independence. For example, a module may be implemented as a hardware circuit comprising custom very large scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, include one or more physical or logical blocks of computer instructions that may, for instance, be organized as an object, procedure, or function. Nevertheless, the executables of an identified module need not be physically located together, but may include disparate instructions stored in different locations that, when joined logically together, comprise the module and achieve the stated purpose for the module. Further, modules may be stored on a computer-readable medium, which may be, for instance, a hard disk drive, flash device, RAM, tape, and/or any other such non-transitory computer-readable medium used to store data without deviating from the scope of the invention.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Figure 6:
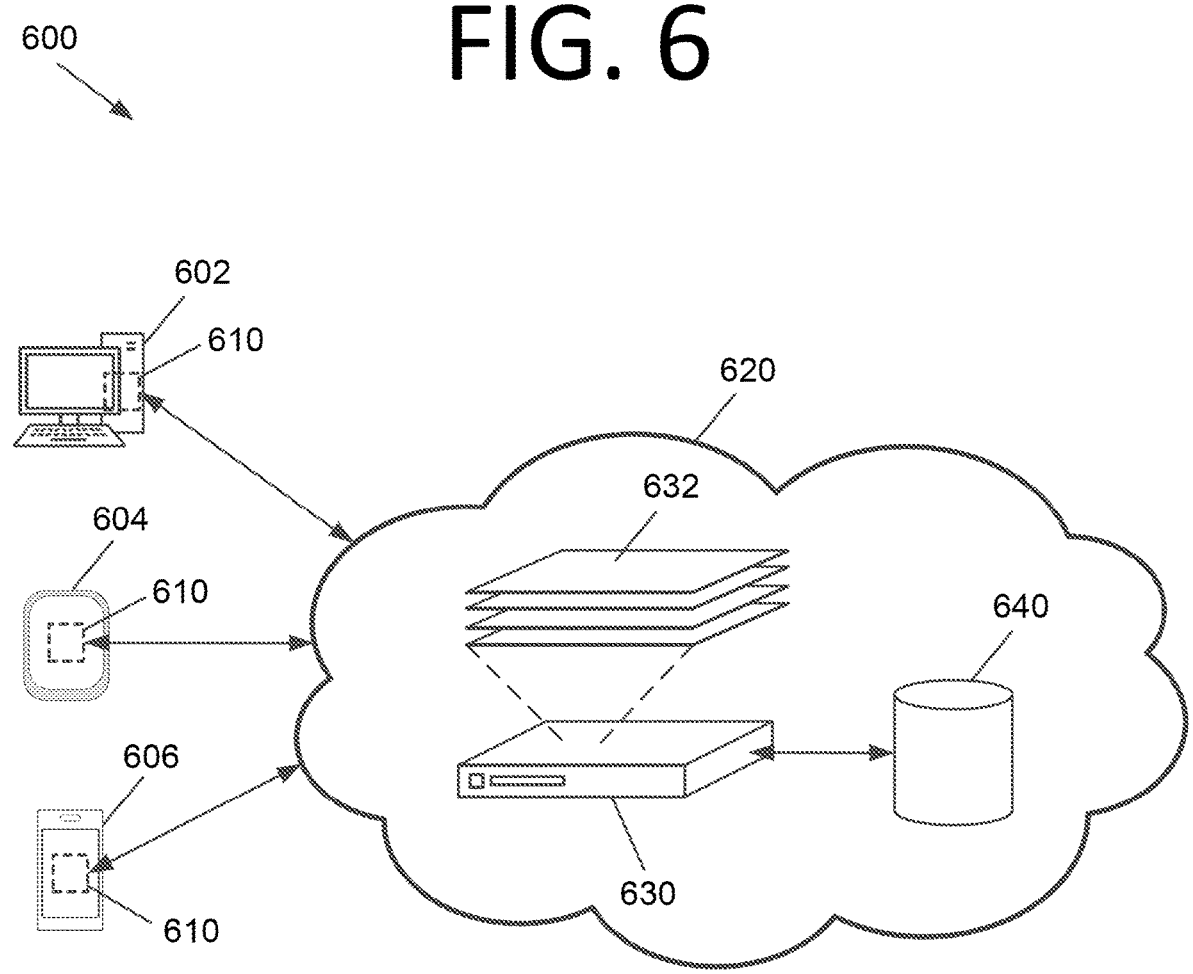
FIG. 6 is an architectural diagram illustrating a system configured to train artificial intelligence/machine learning (AI/ML) models and perform semantic matching between a source screen or source data and a target screen using semantic AI for RPA workflows, according to an embodiment of the present invention.

FIG. 6 is an architectural diagram illustrating a system 600 configured to train AI/ML models and perform semantic matching between a source screen/source data and a target screen using semantic AI for RPA workflows, according to an embodiment of the present invention. System 600 includes user computing systems, such as desktop computer 602, tablet 604, and smart phone 606. However, any desired computing system may be used without deviating from the scope of invention including, but not limited to, smart watches, laptop computers, Internet-of-Things (IoT) devices, vehicle computing systems, etc.

Each computing system 602, 604, 606 has an RPA designer application installed thereon. RPA designer application 610 provides mapping functionality that allows the respective user to select source screens or source data and target screens. RPA designer application 610 is also configured to call AI/ML models 632 of a server 630 via a network 620 (e.g., a local area network (LAN), a mobile communications network, a satellite communications network, the Internet, any combination thereof, etc.). Server 630 stores data in and retrieves data from a database 640.

AL/ML models 632 provide semantic AI functionality, CV, OCR, NLP, etc. For instance, one AI/ML model may provide CV functionality, another may perform OCR, yet another may use this data to perform semantic matching, etc.

Figure 7A:
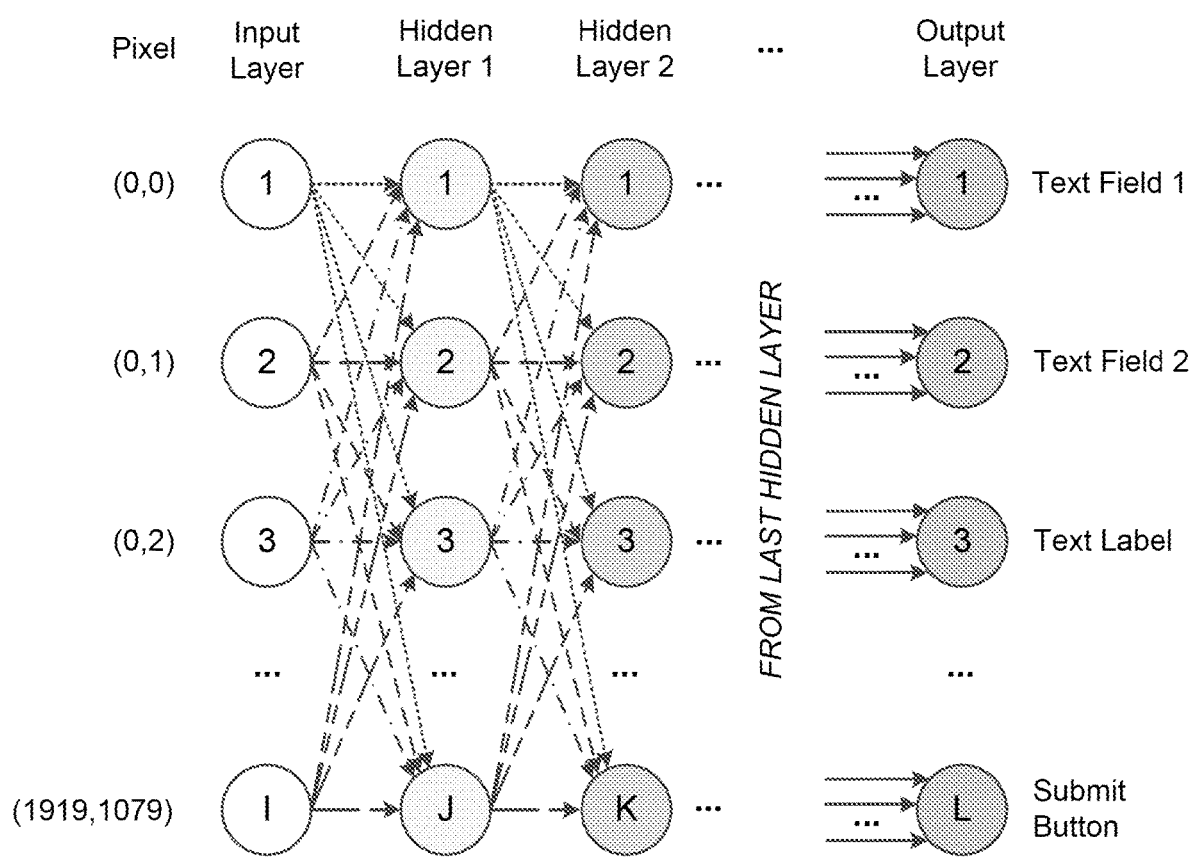
FIG. 7A illustrates an example of a neural network that has been trained to recognize graphical elements in an image, according to an embodiment of the present invention.

FIG. 7A illustrates an example of a neural network 700 that has been trained to recognize graphical elements in an image, according to an embodiment of the present invention. Here, neural network 700 receives pixels of a screenshot image of a 1920×1080 screen as input for input "neurons" 1 to I of the input layer. In this case, I is 2,073,600, which is the total number of pixels in the screenshot image.

Neural network 700 also includes a number of hidden layers. Both DLNNs and SLNNs usually have multiple layers, although SLNNs may only have one or two layers in some cases, and normally fewer than DLNNs. Typically, the neural network architecture includes an input layer, multiple intermediate layers, and an output layer, as is the case in neural network 700.

A DLNN often has many layers (e.g., 10, 50, 200, etc.) and subsequent layers typically reuse features from previous layers to compute more complex, general functions. A SLNN, on the other hand, tends to have only a few layers and train relatively quickly since expert features are created from raw data samples in advance. However, feature extraction is laborious. DLNNs, on the other hand, usually do not require expert features, but tend to take longer to train and have more layers.

For both approaches, the layers are trained simultaneously on the training set, normally checking for overfitting on an isolated cross-validation set. Both techniques can yield excellent results, and there is considerable enthusiasm for both approaches. The optimal size, shape, and quantity of individual layers varies depending on the problem that is addressed by the respective neural network.

Returning to FIG. 7A, pixels provided as the input layer are fed as inputs to the J neurons of hidden layer 1. While all pixels are fed to each neuron in this example, various architectures are possible that may be used individually or in combination including, but not limited to, feed forward networks, radial basis networks, deep feed forward networks, deep convolutional inverse graphics networks, convolutional neural networks, recurrent neural networks, artificial neural networks, long/short term memory networks, gated recurrent unit networks, generative adversarial networks, liquid state machines, auto encoders, variational auto encoders, denoising auto encoders, sparse auto encoders, extreme learning machines, echo state networks, Markov chains, Hopfield networks, Boltzmann machines, restricted Boltzmann machines, deep residual networks, Kohonen networks, deep belief networks, deep convolutional networks, support vector machines, neural Turing machines, or any other suitable type or combination of neural networks without deviating from the scope of the invention.

Hidden layer 2 receives inputs from hidden layer 1, hidden layer 3 receives inputs from hidden layer 2, and so on for all hidden layers until the last hidden layer provides its outputs as inputs for the output layer. It should be noted that numbers of neurons I, J, K, and L are not necessarily equal, and thus, any desired number of layers may be used for a given layer of neural network 700 without deviating from the scope of the invention. Indeed, in certain embodiments, the types of neurons in a given layer may not all be the same.

Neural network 700 is trained to assign a confidence score to graphical elements believed to have been found in the image. In order to reduce matches with unacceptably low likelihoods, only those results with a confidence score that meets or exceeds a confidence threshold may be provided in some embodiments. For instance, if the confidence threshold is 80%, outputs with confidence scores exceeding this amount may be used and the rest may be ignored. In this case, the output layer indicates that two text fields, a text label, and a submit button were found. Neural network 700 may provide the locations, dimensions, images, and/or confidence scores for these elements without deviating from the scope of the invention, which can be used subsequently by an RPA robot or another process that uses this output for a given purpose.

It should be noted that neural networks are probabilistic constructs that typically have a confidence score. This may be a score learned by the AI/ML model based on how often a similar input was correctly identified during training. For instance, text fields often have a rectangular shape and a white background. The neural network may learn to identify graphical elements with these characteristics with a high confidence. Some common types of confidence scores include a decimal number between 0 and 1 (which can be interpreted as a percentage of confidence), a number between negative ∞ and positive ∞, or a set of expressions (e.g., "low," "medium," and "high"). Various post-processing calibration techniques may also be employed in an attempt to obtain a more accurate confidence score, such as temperature scaling, batch normalization, weight decay, negative log likelihood (NLL), etc.

"Neurons" in a neural network are mathematical functions that are typically based on the functioning of a biological neuron. Neurons receive weighted input and have a summation and an activation function that governs whether they pass output to the next layer. This activation function may be a nonlinear thresholded activity function where nothing happens if the value is below a threshold, but then the function linearly responds above the threshold (i.e., a rectified linear unit (ReLU) nonlinearity). Summation functions and ReLU functions are used in deep learning since real neurons can have approximately similar activity functions. Via linear transforms, information can be subtracted, added, etc. In essence, neurons act as gating functions that pass output to the next layer as governed by their underlying mathematical function. In some embodiments, different functions may be used for at least some neurons.

Figure 7B:
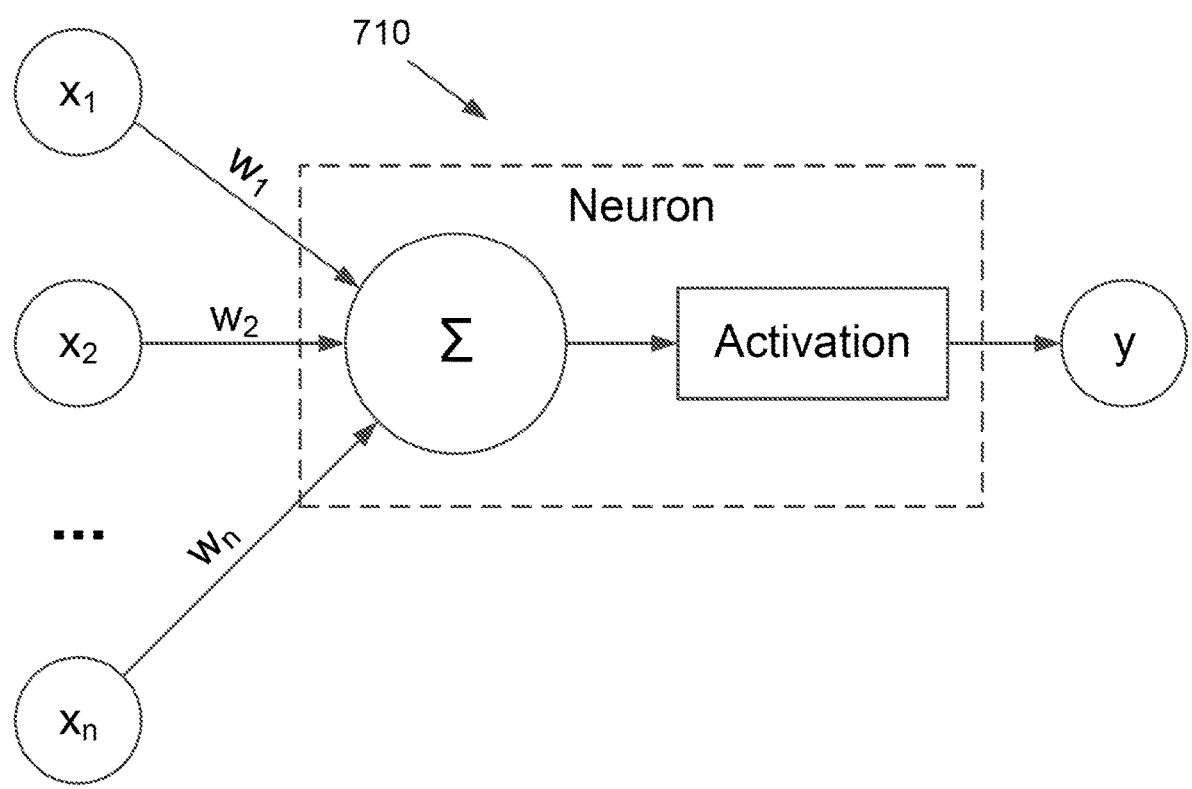
FIG. 7B illustrates an example of a neuron, according to an embodiment of the present invention.

An example of a neuron 710 is shown in FIG. 7B. Inputs $x_1, x_2, \ldots, x_n$ from a preceding layer are assigned respective weights $w_1, w_2, \ldots, w_n$. Thus, the collective input from preceding neuron 1 is $w_1 x_1$. These weighted inputs are used for the neuron's summation function modified by a bias, such as:

$$\sum_{i=1}^{m}(w_i x_i) + \text{bias} \quad (1)$$

This summation is compared against an activation function $f(x)$ to determine whether the neuron "fires". For instance, $f(x)$ may be given by:

$$f(x) = \begin{cases} 1 & \text{if } \sum wx + \text{bias} \geq 0 \\ 0 & \text{if } \sum wx + \text{bias} < 0 \end{cases} \quad (2)$$

The output y of neuron 710 may thus be given by:

$$y = f(x) \sum_{i=1}^{m}(w_i x_i) + \text{bias} \quad (3)$$

In this case, neuron 710 is a single-layer perceptron. However, any suitable neuron type or combination of neuron types may be used without deviating from the scope of the invention.

The goal, or "reward function" is often employed, such as for this case the successful identification of graphical elements in the image. A reward function explores intermediate transitions and steps with both short term and long term rewards to guide the search of a state space and attempt to achieve a goal (e.g., successful identification of graphical elements, successful identification of a next sequence of activities for an RPA workflow, etc.).

During training, various labeled data (in this case, images) are fed through neural network 700. Successful identifications strengthen weights for inputs to neurons, whereas unsuccessful identifications weaken them. A cost function, such as mean square error (MSE) or gradient descent may be used to punish predictions that are slightly wrong much less than predictions that are very wrong. If the performance of the AI/ML model is not improving after a certain number of training iterations, a data scientist may modify the reward function, provide indications of where non-identified graphical elements are, provide corrections of misidentified graphical elements, etc.

Backpropagation is a technique for optimizing synaptic weights in a feedforward neural network. Backpropagation may be used to "pop the hood" on the hidden layers of the neural network to see how much of the loss every node is responsible for, and subsequently updating the weights in such a way that minimizes the loss by giving the nodes with higher error rates lower weights, and vice versa. In other words, backpropagation allows data scientists to repeatedly adjust the weights so as to minimize the difference between actual output and desired output.

The backpropagation algorithm is mathematically founded in optimization theory. In supervised learning, training data with a known output is passed through the neural network and error is computed with a cost function from known target output, which gives the error for backpropagation. Error is computed at the output, and this error is transformed into corrections for network weights that will minimize the error.

In the case of supervised learning, an example of backpropagation is provided below. A column vector input x is processed through a series of N nonlinear activity functions $f_i$ between each layer $i=1, \ldots, N$ of the network, with the output at a given layer first multiplied by a synaptic matrix $W_i$, and with a bias vector $b_i$ added. The network output o, given by $$o = f_N(W_N f_{N-1}(W_{N-1} f_{N-2}(\ldots f_1(W_1 x + b_1) \ldots) + b_{N-1}) + b_N) \quad (4)$$

In some embodiments, o is compared with a target output t, resulting in an error $E = \frac{1}{2}\|o - t\|^2$, which is desired to be minimized.

Optimization in the form of a gradient descent procedure may be used to minimize the error by modifying the synaptic weights $W_i$ for each layer. The gradient descent procedure requires the computation of the output o given an input x corresponding to a known target output t, and producing an error o−t. This global error is then propagated backwards giving local errors for weight updates with computations similar to, but not exactly the same as, those used for forward propagation. In particular, the backpropagation step typically requires an activity function of the form $p_j(n_j) = f_j'(n_j)$, where $n_j$ is the network activity at layer j (i.e., $n_j = W_j o_{j-1} + b_j$) where $o_j = f_j(n_j)$ and the apostrophe' denotes the derivative of the activity function $f$.

The weight updates may be computed via the formulae:

$$d_j = \begin{cases} (o - t) \cdot p_j(n_j), & j = N \\ W_{j+1}^T d_{j+1} \cdot p_j(n_j), & j < N \end{cases} \quad (5)$$

$$\frac{\partial E}{\partial W_{j+1}} = d_{j+1}(o_j)^T \quad (6)$$

$$\frac{\partial E}{\partial b_{j+1}} = d_{j+1} \quad (7)$$

$$W_j^{new} = W_j^{old} - \eta \frac{\partial E}{\partial W_j} \quad (8)$$

$$b_j^{new} = b_j^{old} - \eta \frac{\partial E}{\partial b_j} \quad (9)$$

where $\circ$ denotes a Hadamard product (i.e., the element-wise product of two vectors), $T$ denotes the matrix transpose, and $o_j$ denotes $f_j(W_j o_{j-1} + b_j)$, with $o_0 = x$. Here, the learning rate $\eta$ is chosen with respect to machine learning considerations. Below, $\eta$ is related to the neural Hebbian learning mechanism used in the neural implementation. Note that the synapses W and b can be combined into one large synaptic matrix, where it is assumed that the input vector has appended ones, and extra columns representing the b synapses are subsumed to W.

The AI/ML model is trained over multiple epochs until it reaches a good level of accuracy (e.g., 97% or better using an F2 or F4 threshold for detection and approximately 2,000 epochs). This accuracy level may be determined in some embodiments using an F1 score, an F2 score, an F4 score, or any other suitable technique without deviating from the scope of the invention. Once trained on the training data, the AI/ML model is tested on a set of evaluation data that the AI/ML model has not encountered before. This helps to ensure that the AI/ML model is not "over fit" such that it identifies graphical elements in the training data well, but does not generalize well to other images.

In some embodiments, it may not be known what accuracy level may be achieved. Accordingly, if the accuracy of the AI/ML model is starting to drop when analyzing the evaluation data (i.e., the model is performing well on the training data, but is starting to perform less well on the evaluation data), the AI/ML model may go through more epochs of training on the training data (and/or new training data). In some embodiments, the AI/ML model is only deployed if the accuracy reaches a certain level or if the accuracy of the trained AI/ML model is superior to an existing deployed AI/ML model.

In certain embodiments, a collection of trained AI/ML models may be used to accomplish a task, such as employing an AI/ML model for each type of graphical element of interest, employing an AI/ML model to perform OCR, deploying yet another AI/ML model to recognize proximity relationships between graphical elements, employing still another AI/ML model to generate an RPA workflow based on the outputs from the other AI/ML models, etc. This may collectively allow the AI/ML models to enable semantic automation, for instance.

Some embodiments may use transformer networks such as SentenceTransformers™, which is a Python™ framework for state-of-the-art sentence, text, and image embeddings. Such transformer networks learn associations of words and phrases that have both high scores and low scores. This trains the AI/ML model to determine what is close to the input and what is not, respectively. Rather than just using pairs of words/phrases, transformer networks may use the field length and field type, as well.

Figure 8:
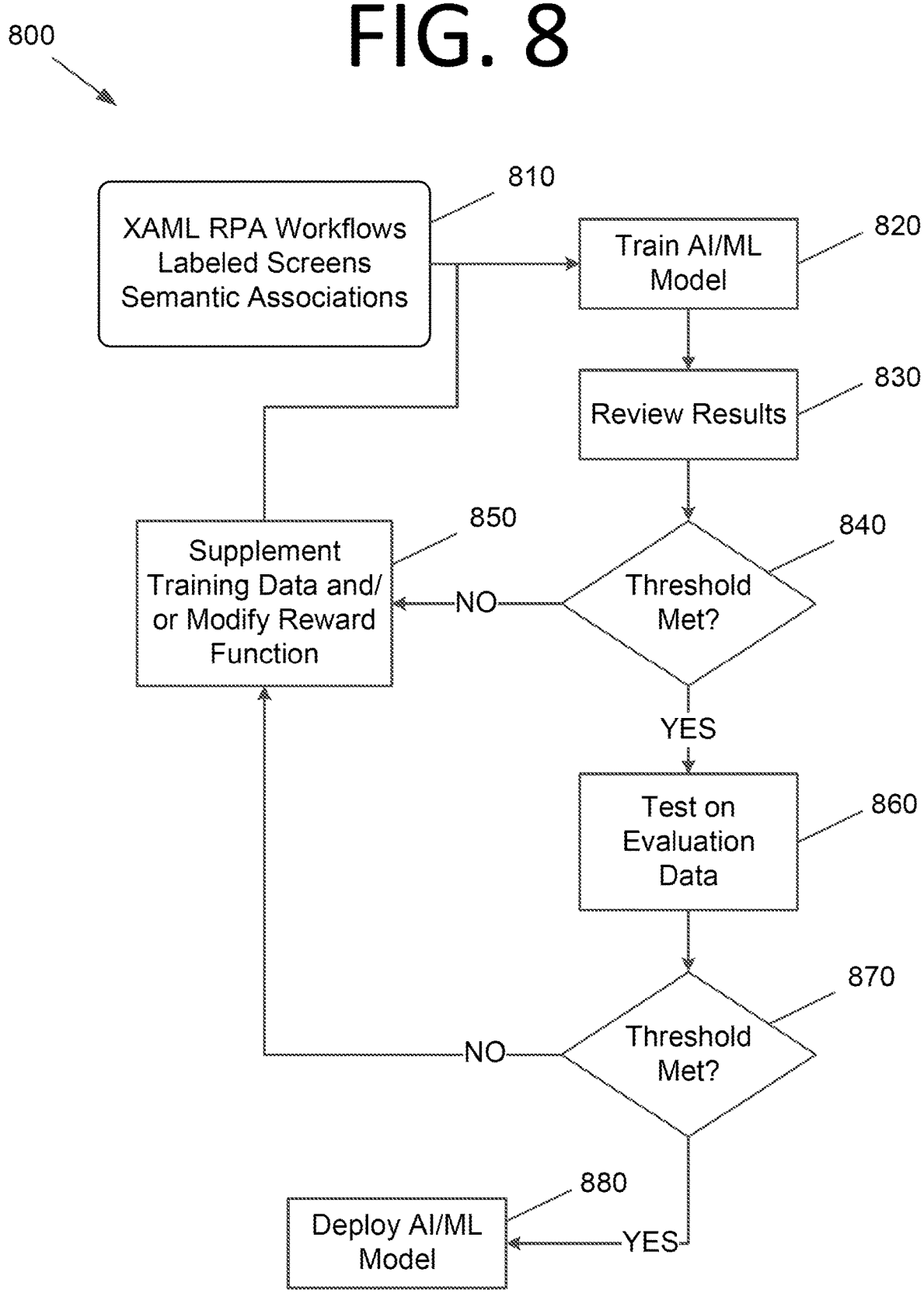
FIG. 8 is a flowchart illustrating a process for training AI/ML model(s) to perform semantic matching between a source screen or source data and a target screen using semantic AI for RPA workflows, according to an embodiment of the present invention.

FIG. 8 is a flowchart illustrating a process 800 for training AI/ML model(s) to perform semantic matching between a source screen or source data and a target screen using semantic AI for RPA workflows, according to an embodiment of the present invention. The process begins with providing labeled screens (e.g., with graphical elements and text identified), words and phrases, a "thesaurus" of semantic associations between words and phrases such that similar words and phrases for a given word or phrase can be identified, etc. at 810. The AI/ML model is then trained over multiple epochs at 820 and results are reviewed at 830.

If the AI/ML model fails to meet a desired confidence threshold at 840, the training data is supplemented and/or the reward function is modified to help the AI/ML model achieve its objectives better at 850 and the process returns to step 820. If the AI/ML model meets the confidence threshold at 840, the AI/ML model is tested on evaluation data at 860 to ensure that the AI/ML model generalizes well and that the AI/ML model is not over fit with respect to the training data. The evaluation data may include source screens, source data, and target screens that the AI/ML model has not processed before. If the confidence threshold is met at 870 for the evaluation data, the AI/ML model is deployed at 880. If not, the process returns to step 850 and the AI/ML model is trained further.

Some embodiments bring semantic automation into automation platforms for creating fully automated workflows with less or minimal interaction input from the developer. Using semantic mapping, the UI fields from a data source/source screen are mapped to UI fields on the target screen semantically using one or more AI/ML models, and fully automated workflows can be created from this semantic mapping without intervention by the developer. In a current prototype, the mapping can be achieved for up to 80% of the UI fields, and with developer assistance, the remaining ~20% can be mapped. The AI/ML model(s) can be retrained to learn to match the UI fields more accurately over time, with the expectation that the mapping will approach 100% accuracy in the future.

In some embodiments, the RPA designer application includes a semantic matching feature that allows RPA developers to perform a match between two screens or between data (e.g., customer data) and a screen. This may be implemented as a "semantic AI" button on a ribbon, dropdown menu, or another suitable user interface element, for example. Upon selection of semantic AI functionality, the RPA designer application may display a matching interface, such as matching interface 900 of FIGS. 9A-G. While this is a general example, many use cases exist for the semantic AI provided by embodiments of the present invention, such as mapping an invoice to SAP®, automatically inputting data from an excel spreadsheet into a CRM application, mapping XAML from an RPA workflow to another RPA workflow, etc. Also, while this example consists of text fields, other graphical elements, such as buttons, text areas, etc. may be mapped without deviating from the scope of the invention.

Matching interface 900 includes a mapping options pane 910 and a mapping pane 920. When the developer selects map screens option 912, a select source button 922 and a select target button 924 appear in mapping pane 920. The user can return to the previous designer application screen by clicking back button 930. When the user clicks one of these buttons, the user can select the source and target using indicate on screen functionality similar to or the same as that of UiPath Studio™ in some embodiments. See, for example, U.S. patent application Ser. No. 17/100,146. This causes a selected source screen 940 and a selected target screen 950 to be displayed in mapping pane 920. It should be noted that source screen 940 and/or target screen 950 may be application windows, portions of displayed applications, etc.

When the user clicks map button 932, the designer application calls one or more AI/ML models that perform OCR and CV on source screen 940 and target screen 950, runs semantic AI analysis attempting to match fields in source screen 940 with those of target screen 950, and displays matches with confidence scores that meet or exceed a confidence threshold. See FIG. 9B. A global confidence score 960 is also displayed. The mappings may be stored in an object repository in some embodiments for future use for the same or similar screens. See, for example, U.S. patent application Ser. No. 16/922,289.

In this example, designer application, via the AI/ML model(s), was able to correctly match most of the fields in source screen 940 and target screen 950. The Currency field of source screen 940 was left blank, so a match was not attempted for this graphical element. However, matches for the Company field and the Invoice #field were not found, and this is indicated to the developer by displaying these elements highlighted in a different color and with a confidence score of 0.

The developer is able to manually match fields that were not matched by the AI/ML model(s), and the user matching information is automatically stored as labeled training data for retraining of the AI/ML model(s) in some embodiments. For instance, the source and target screens may be saved, along with bounding box information (e.g., coordinates) and the coordinates and text of labels associated with the matched fields in source screen 940 and target screen 950. This is seen, for example, in FIG. 9C, where the user has indicated that the Invoice #field of source screen 940 matches the Inv. Num. field of target screen 950. This causes the confidence score for that element and the global confidence score 960 to increase accordingly.

In some embodiments, the developer may be prompted or otherwise permitted to provide synonyms for target field names. For instance, in the example of FIG. 9C, the user is prompted to type synonyms for the Inv. Num. field in synonyms text field 952 since this element was not correctly identified. For instance, the developer could add "Invoice Number", "Billing Number" "Invoice ID", "Billing ID", etc. In certain embodiments the developer may be able to enter synonyms even if a given graphical element was correctly identified. This functionality also allows developers to add their own terms and context. For instance, if the target application is a tool that the AI/ML model has not seen before, the developer may add terms to make the AI/ML model more accurate for that tool. This information may then be used to train the AI/ML model so it becomes more accurate not only for that tool, but for similar words and phrases found in other target screens globally.

In certain embodiments, synonyms may be proposed to the developer. These can be accepted or rejected in order to make the AI/ML model more accurate for that context. This allows the AI/ML model to learn both positive and negative examples. It also allows the AI/ML model to learn different subsets of synonyms, or alternative sets of synonyms, that are applicable to a given context.

Source data other than images can also be used in some embodiments. For example, when the developer selects map data option 914 and clicks select source button 926 in FIG. 9D, data source options 927 appear. See FIG. 9E. The developer can select the desired source data format, such as Excel®, JavaScript® Object Notation (JSON), XAML of an RPA workflow, a comma separated variable (CSV) file, etc.

Figure 9A:
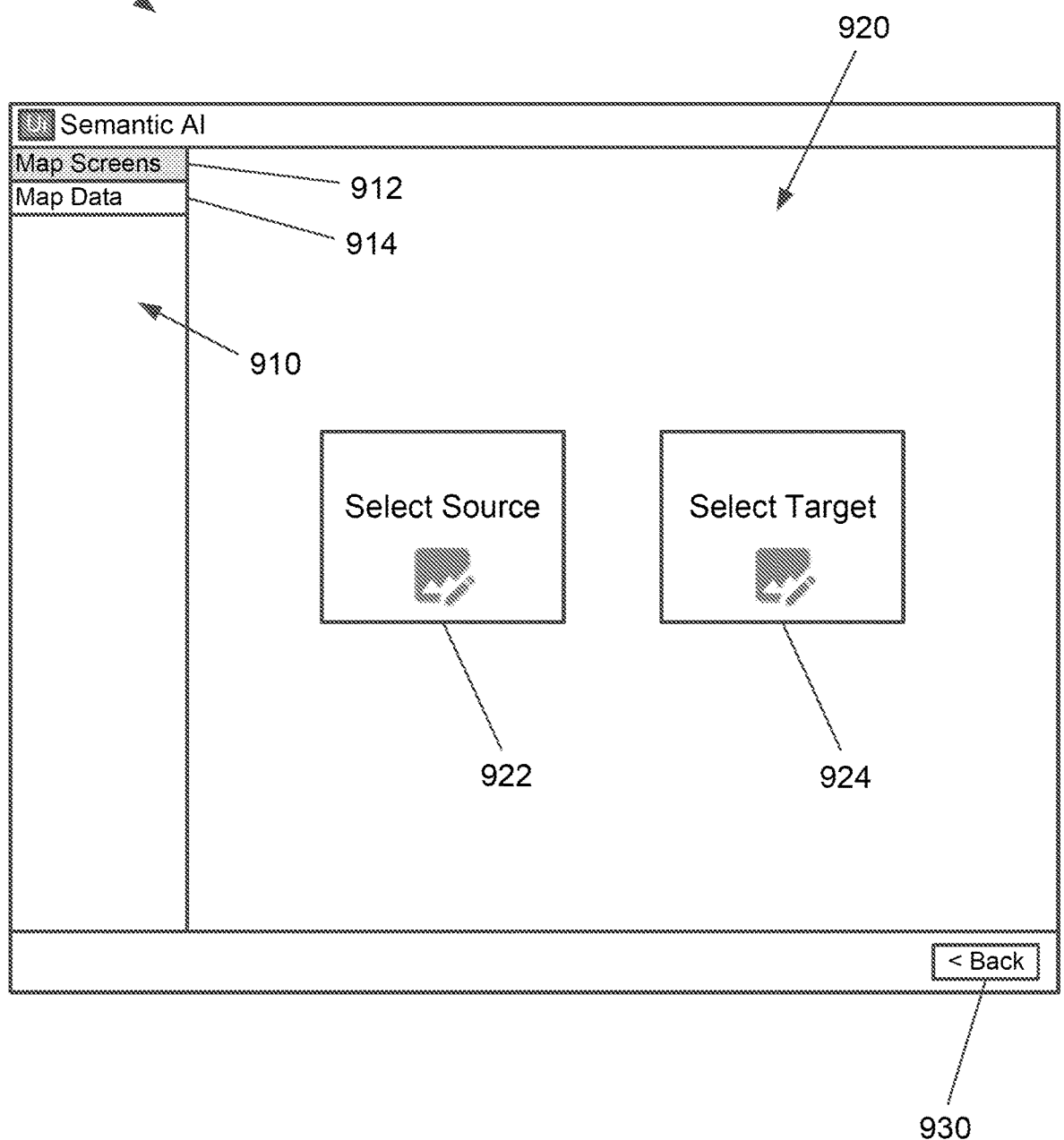
FIGS. 9A-G illustrate a matching interface for an RPA designer application, according to an embodiment of the present invention.
Figure 9B:
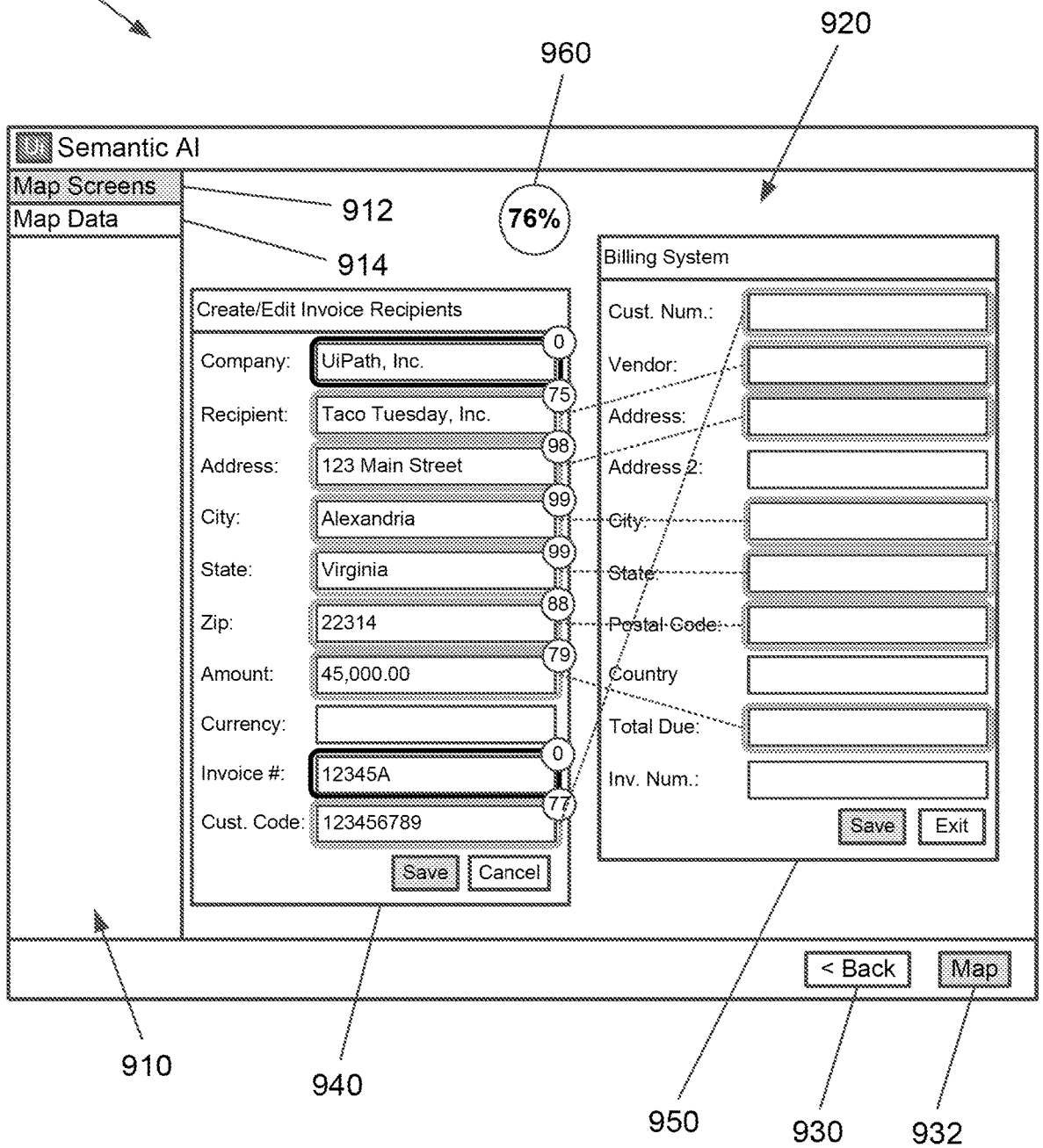
Figure 9C:
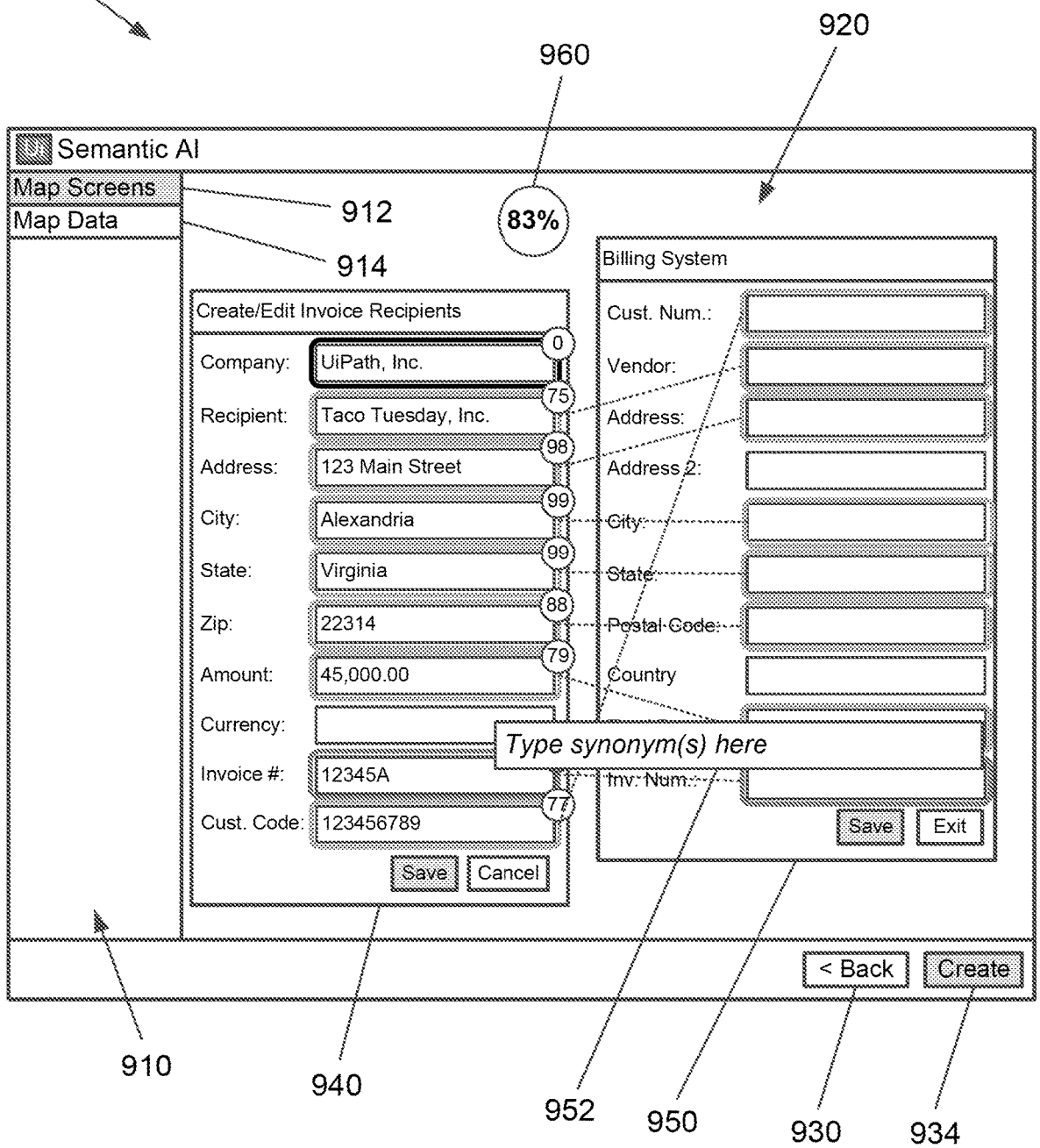
Figure 9D:
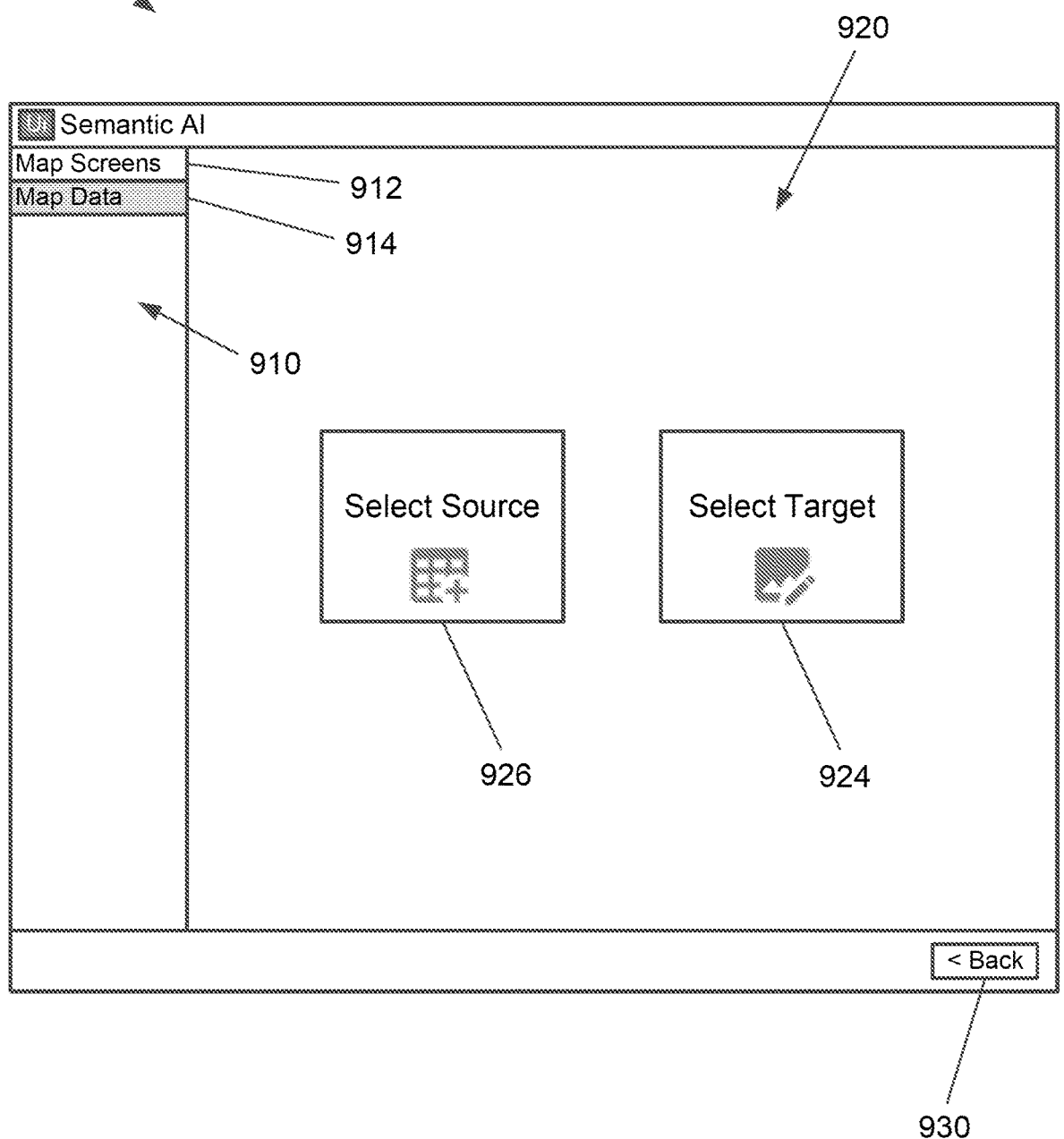
Figure 9E:
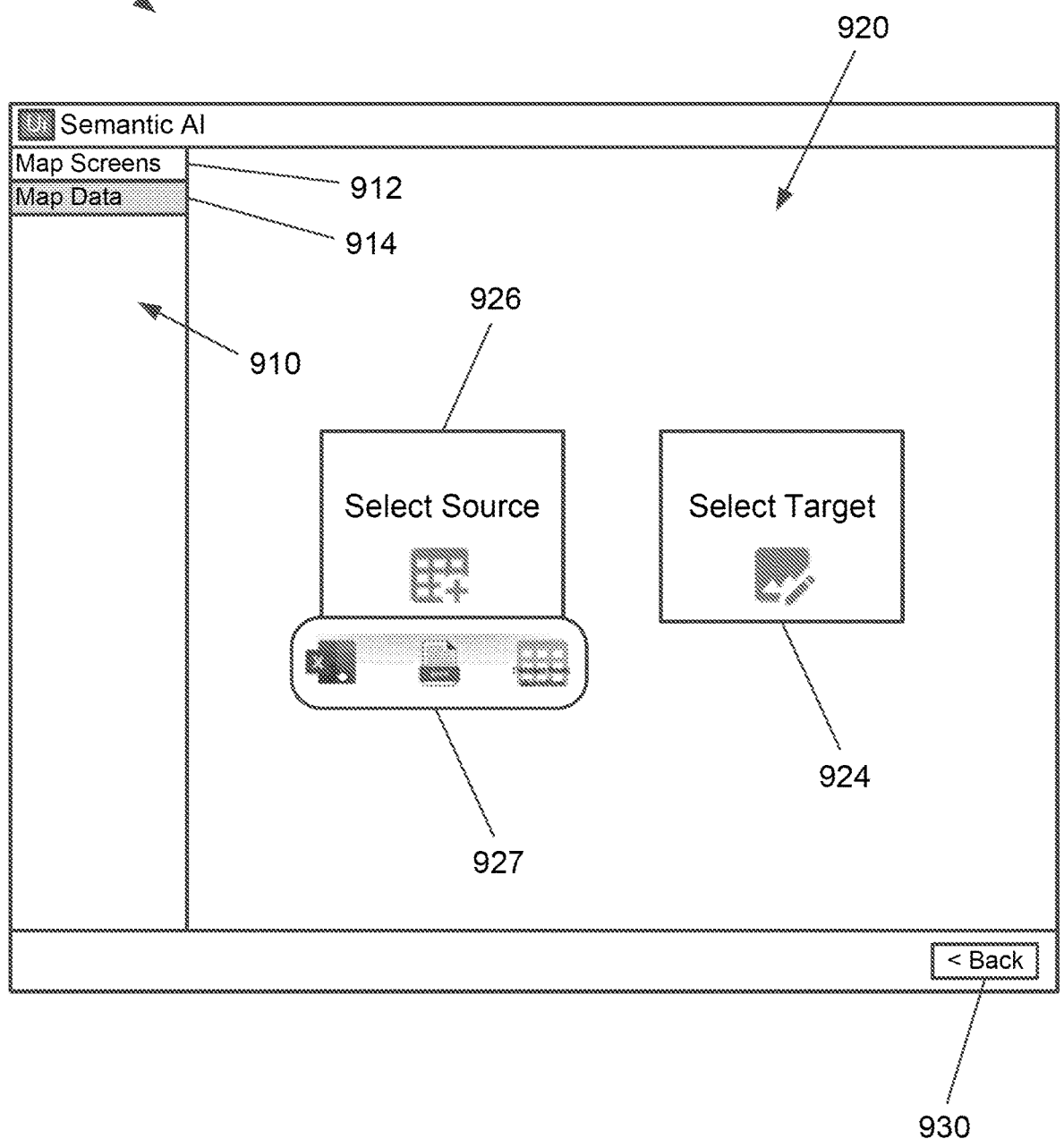
Figure 9F:
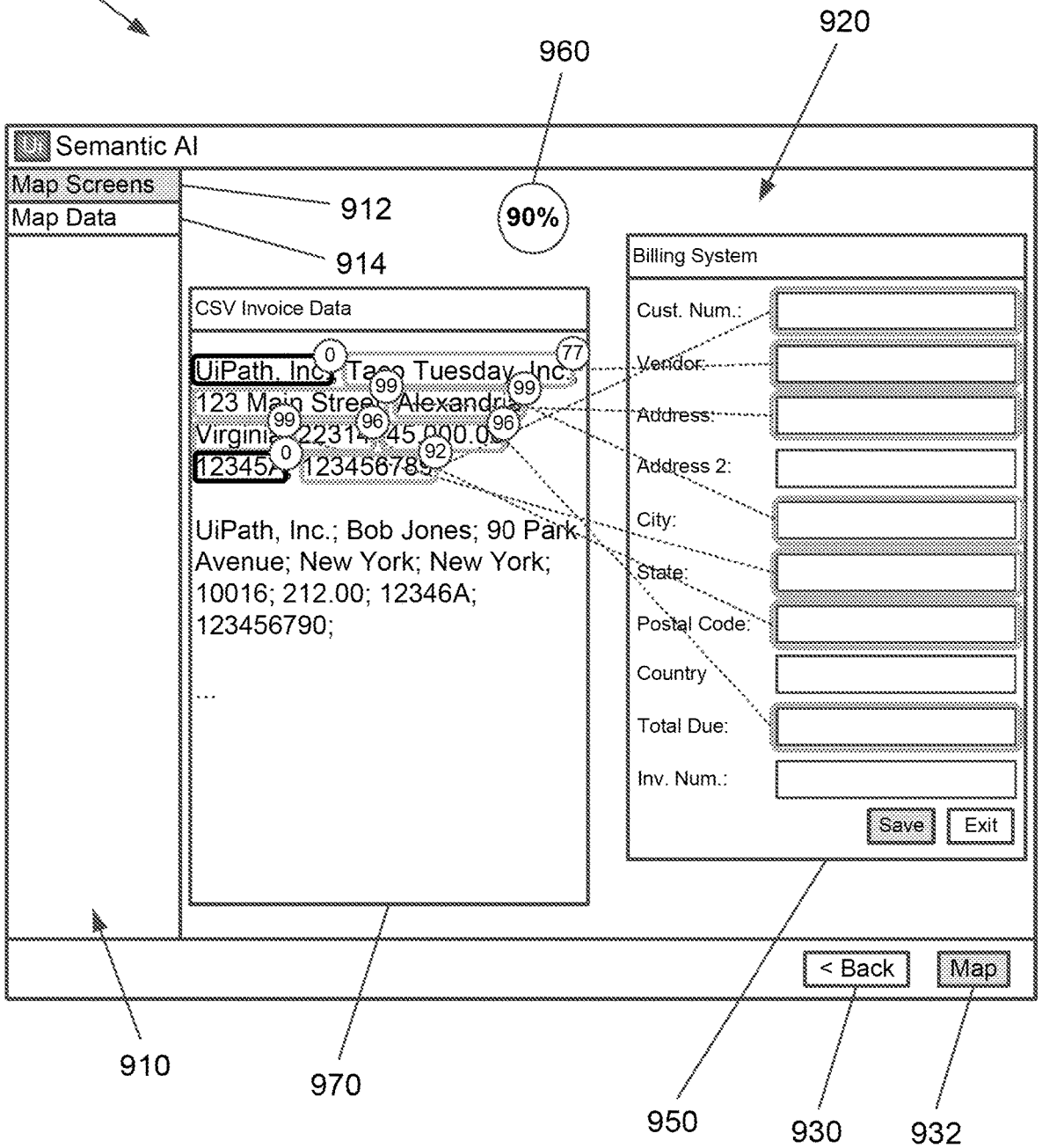
Figure 9G:
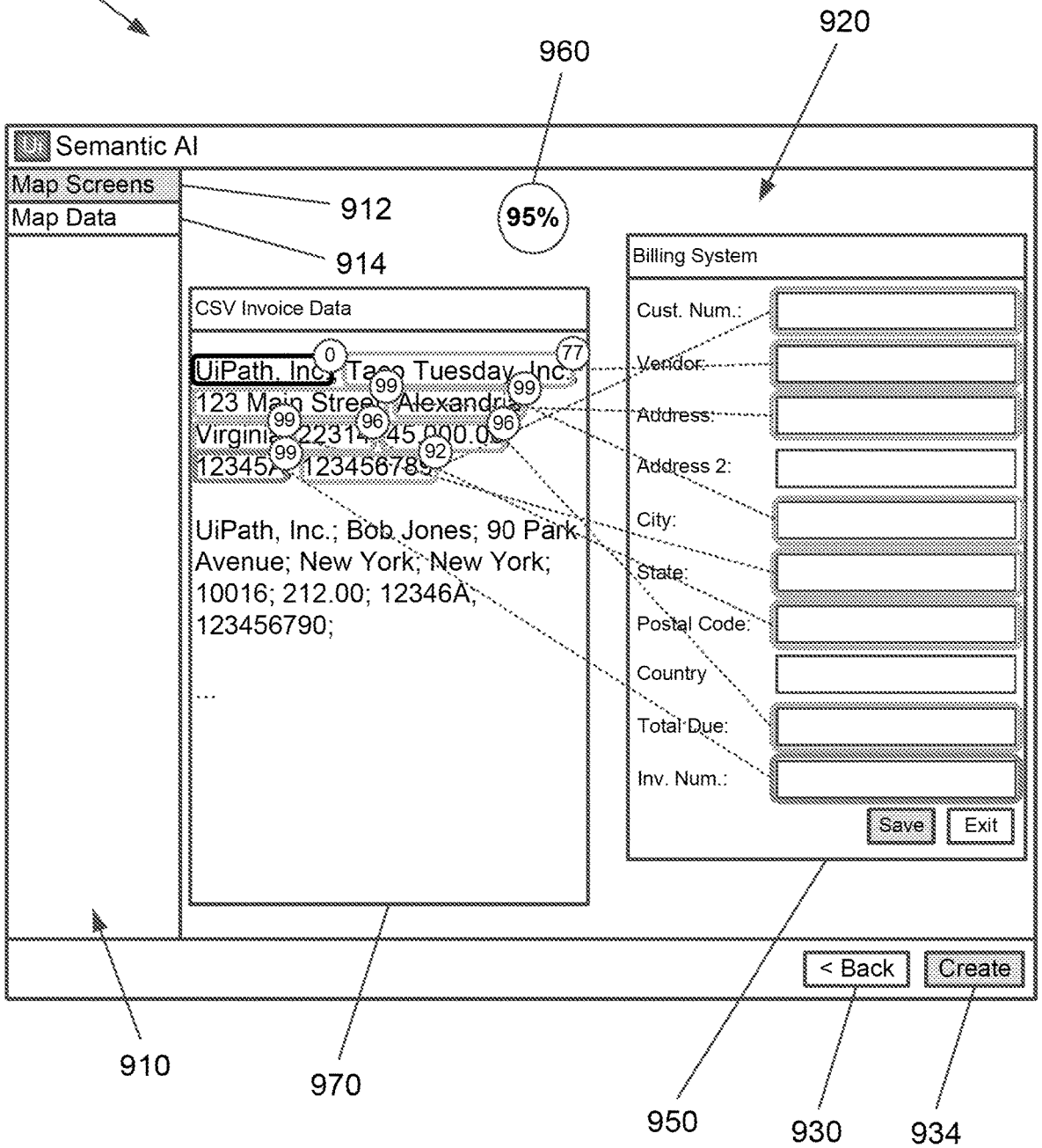

Data source 970 and target image 950 are then displayed. When the developer clicks map button 932, the AI/ML model(s) attempt to match the source information to fields in target image 950. See FIG. 9F. In this case, source data 970 includes the same information as source screen 940. In FIG. 9G, the developer makes a similar correction to that in FIG. 9C, and global confidence score 960 improves.

Relationships between labels in the source screen and target screen may be used to determine what a given text field is meant to represent, although the text fields may be similar to or the same as one another. This may be accomplished by assigning one or more anchors to a given text field. For instance, because the field City appears directly to the left of its associated text field in target screen 950 and no other text field includes this label, the designer application and/or AI/ML model(s) may determine that these fields are linked, and assign the City label as an anchor for the target text field. If the label does not uniquely identify the text field, one or more other graphical elements may be assigned as anchors, and their geometric relationships may be used to uniquely identify the given target element. See, for example, U.S. Pat. No. 10,936,351 and U.S. patent application Ser. No. 17/100,146.

After the source screen or source data and the target screen have been mapped, the user can click Create button 934 to automatically generate one or more activities in the RPA workflow that implement the desired mapping. See FIGS. 9C and 9G. This causes the RPA workflow activities to be automatically created. In some embodiments, the RPA workflow is immediately executed to perform the mapping task desired by the user after creation.

To automatically create the RPA workflow, the designer application may make use of a UI object repository. See, for example, U.S. patent application Publication Ser. No. 16/922,289. A UI object repository (e.g., the UiPath Object Repository™) is a collection of UI object libraries, which are themselves collections of UI descriptors (e.g., for a certain version of an application and one or more screens thereof). Unified target controls for similar graphical elements can be obtained from the UI object repository, which instruct the RPA robot how to interact with a given graphical element.

Figure 10:
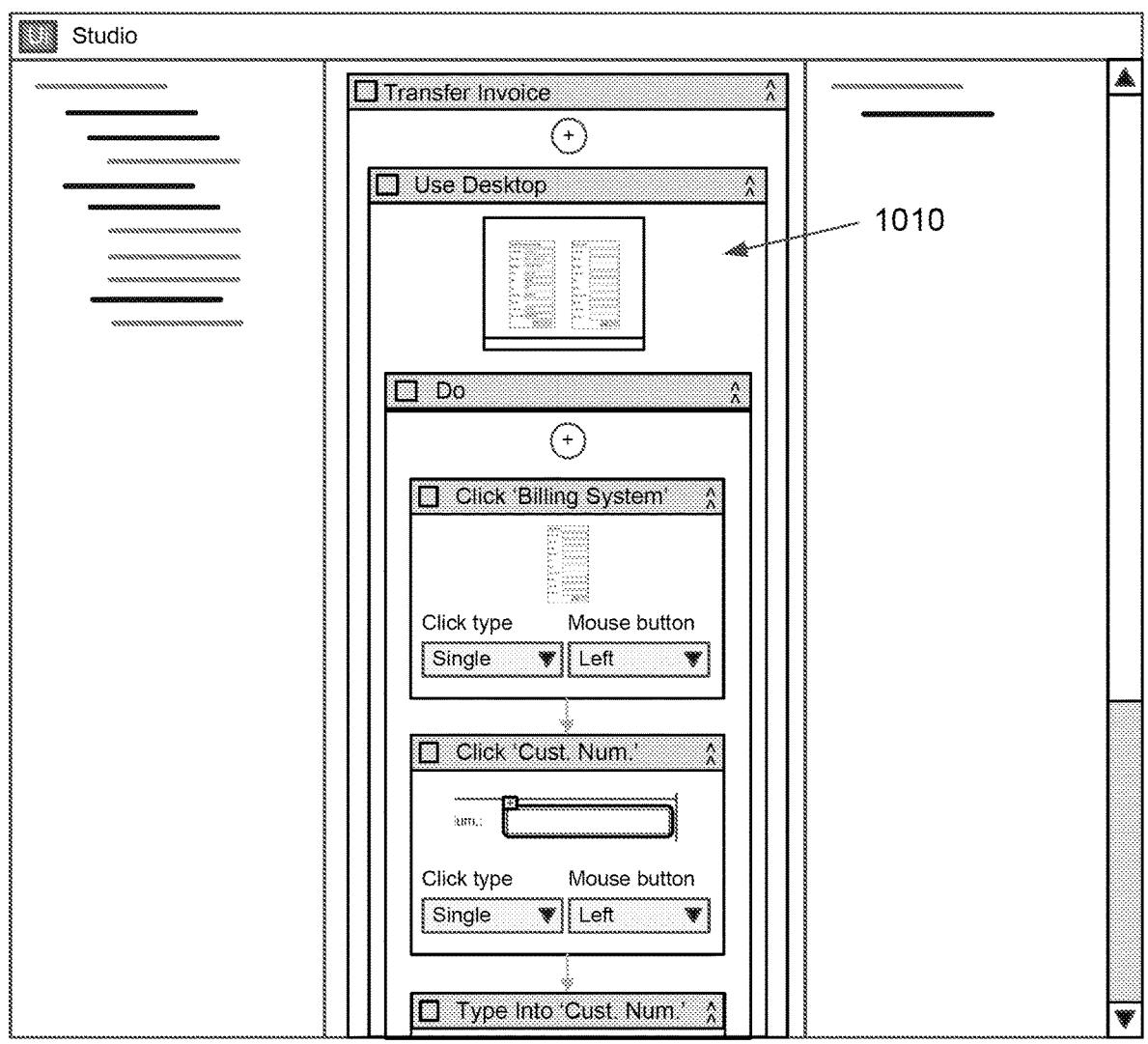
FIG. 10 illustrates an RPA designer application with an automatically generated RPA workflow, according to an embodiment of the present invention.

Such an example is shown in FIG. 10, which illustrates an RPA designer application 1000 with automatically generated activities in an RPA workflow 1010, according to an embodiment of the present invention. The semantic matching AI/ML model(s) have been trained to recognize associations between the source screen or source data and the target screen, per the above. In the case of the example of FIGS. 9A-G and 10, the semantic matching AI/ML model(s) are able to determine that data from fields in the source screen or source data should be copied into the matching fields in the target screen. Accordingly, RPA designer application 1000 knows to obtain UI descriptors for the target elements from the UI object repository, add activities to RPA workflow 1010 that click on the target screen, click on each target field, and enter the text from the source screen or data source into the respective matching fields in the target screen using these UI descriptors. RPA designer application 1000 automatically generates one or more activities in RPA workflow 1010 that implement this functionality. In some embodiments, the developer may not be permitted to modify these activities. However, in certain embodiments, the developer may be able to modify configurations for the activities, have full permissions for editing the activities, etc. In some embodiments, the RPA designer application automatically generates an RPA robot implementing the RPA workflow and executes the RPA robot so information from the source screen or source data is automatically copied into the target screen without further direction from the developer.

Figure 11A:
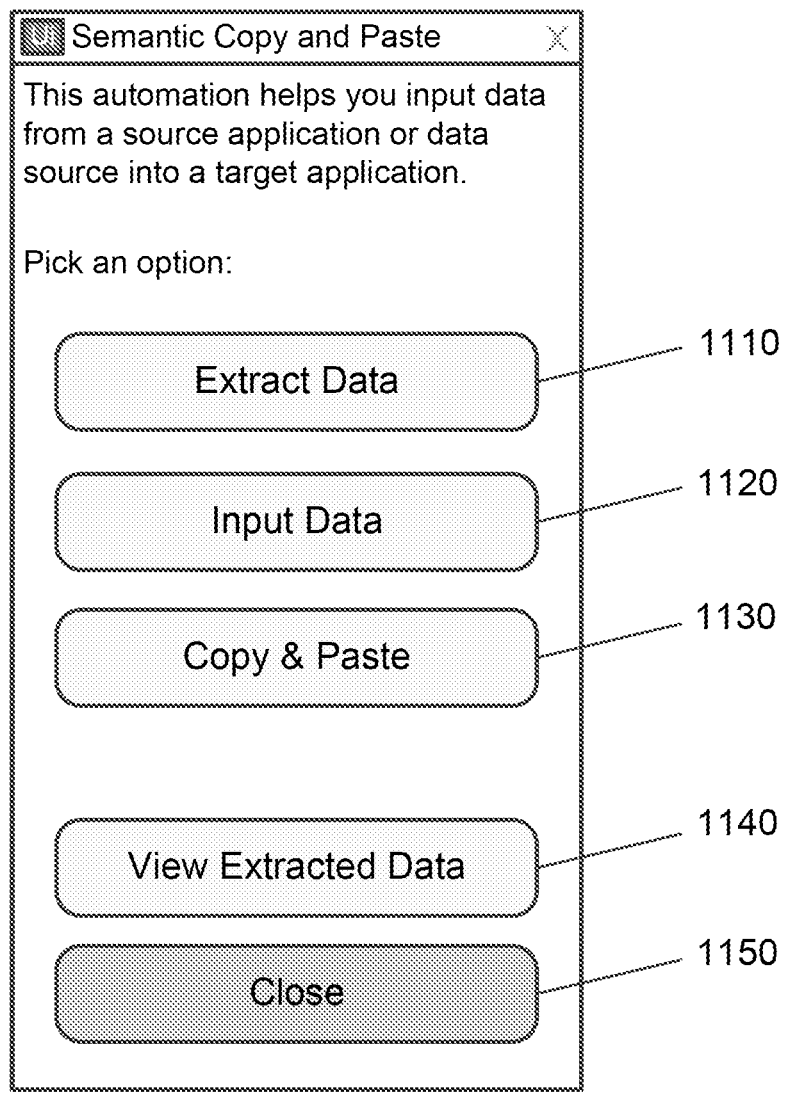
FIG. 11A-N illustrate screens of an example semantic copy and paste interface, according to an embodiment of the present invention.

Some embodiments provide a semantic copy and paste feature that allows developers without substantial programming experience to perform semantic automation. FIG. 11A illustrates a semantic copy and paste interface 1100, according to an embodiment of the present invention. In some embodiments, semantic copy and paste interface 1100 is part of an RPA designer application. However, in certain embodiments, semantic copy and paste interface 1100 is part of a stand-alone application. Semantic copy and paste interface 1100 includes an extract data button 1110, an input data button 1120, a copy and paste button 1130, a view extracted data button 1140, and a close button 1150. Using semantic copy and paste interface 1100, a user can extract data, input data, or perform copy and paste from a source application to a target application.

Figure 11B:
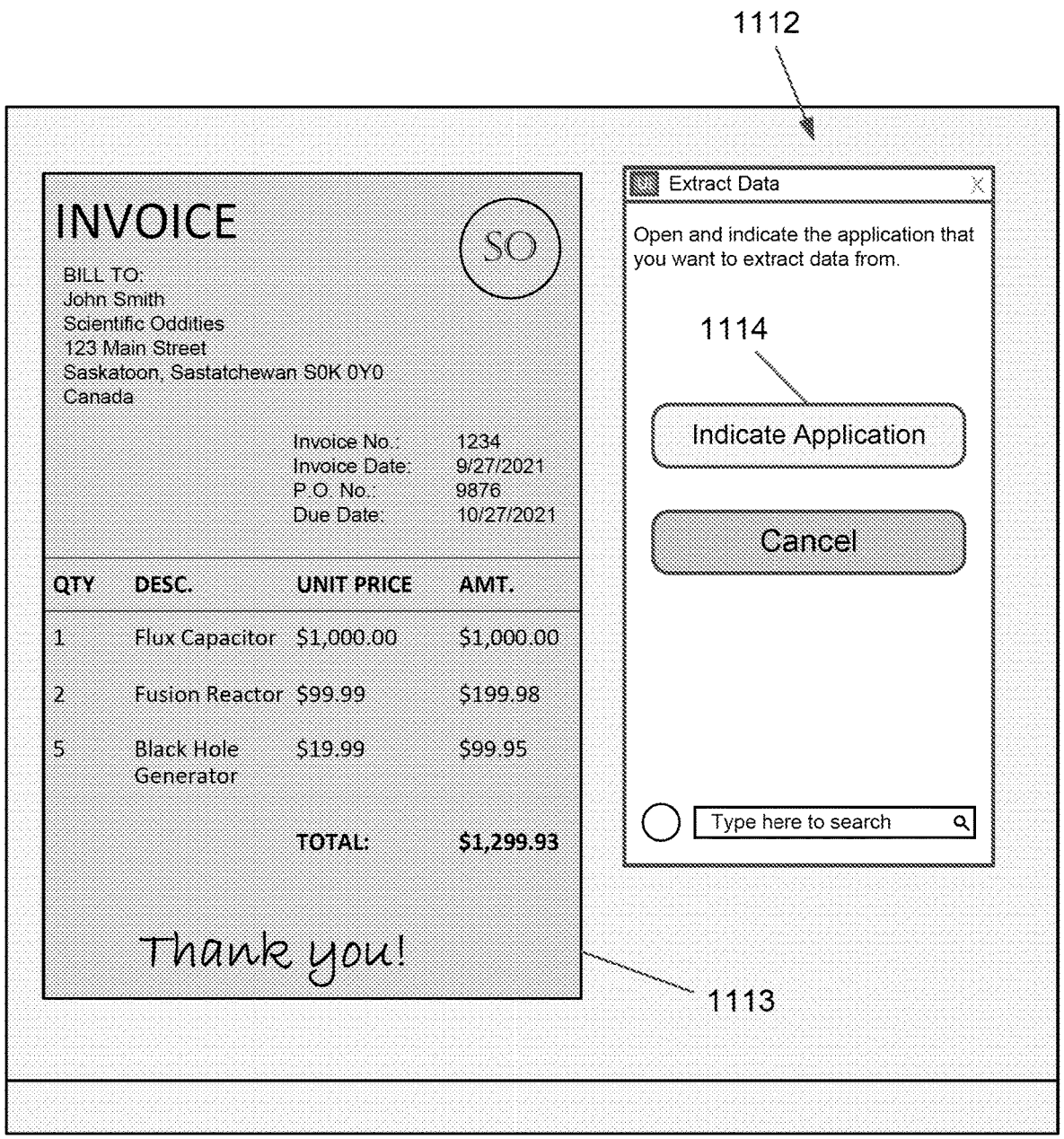

Upon clicking extract data button 1110, the designer application asks the developer to open and indicate the application that he or she wants to extract data from via a data extraction interface 1112. See FIG. 11B. When the user clicks indicate application button 1114 of data extraction interface 1112, indicate on screen functionality is enabled (e.g., the same as or similar to that provided by UiPath Studio™) The user can then select invoice 1116 as the data source.

Figure 11C:
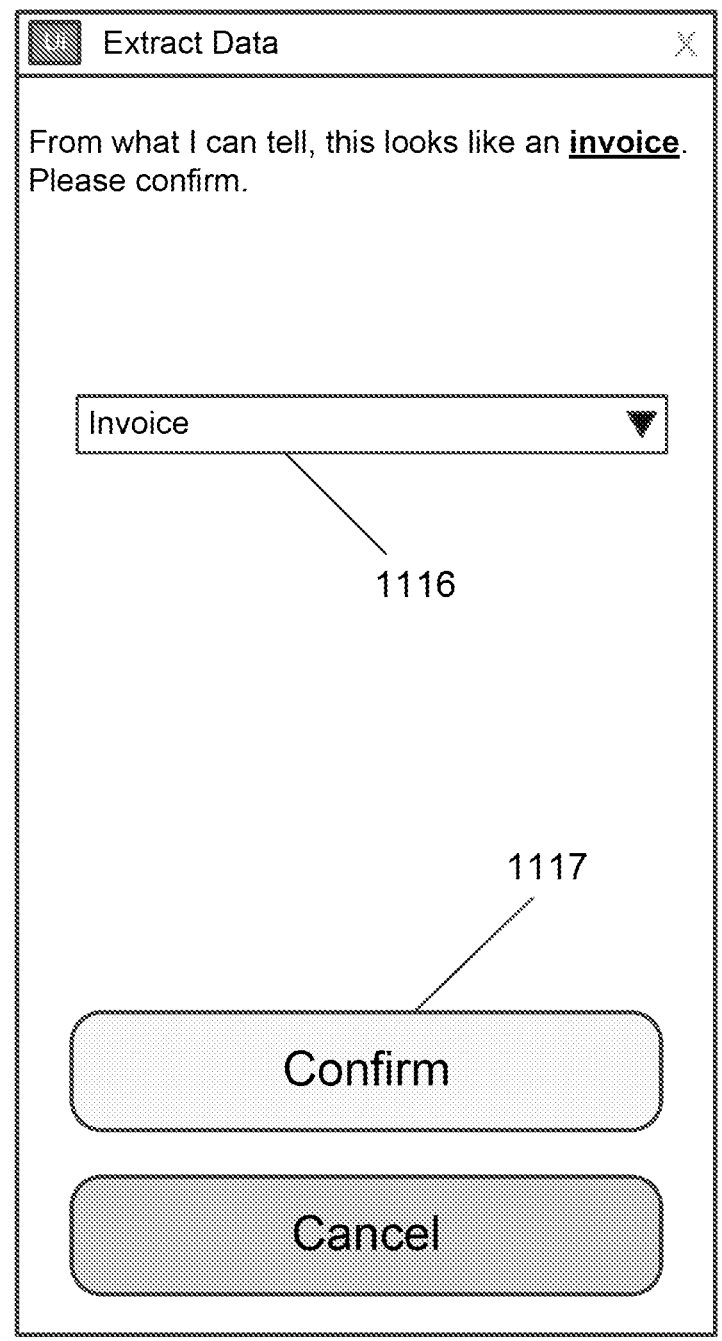
Figure 11D:
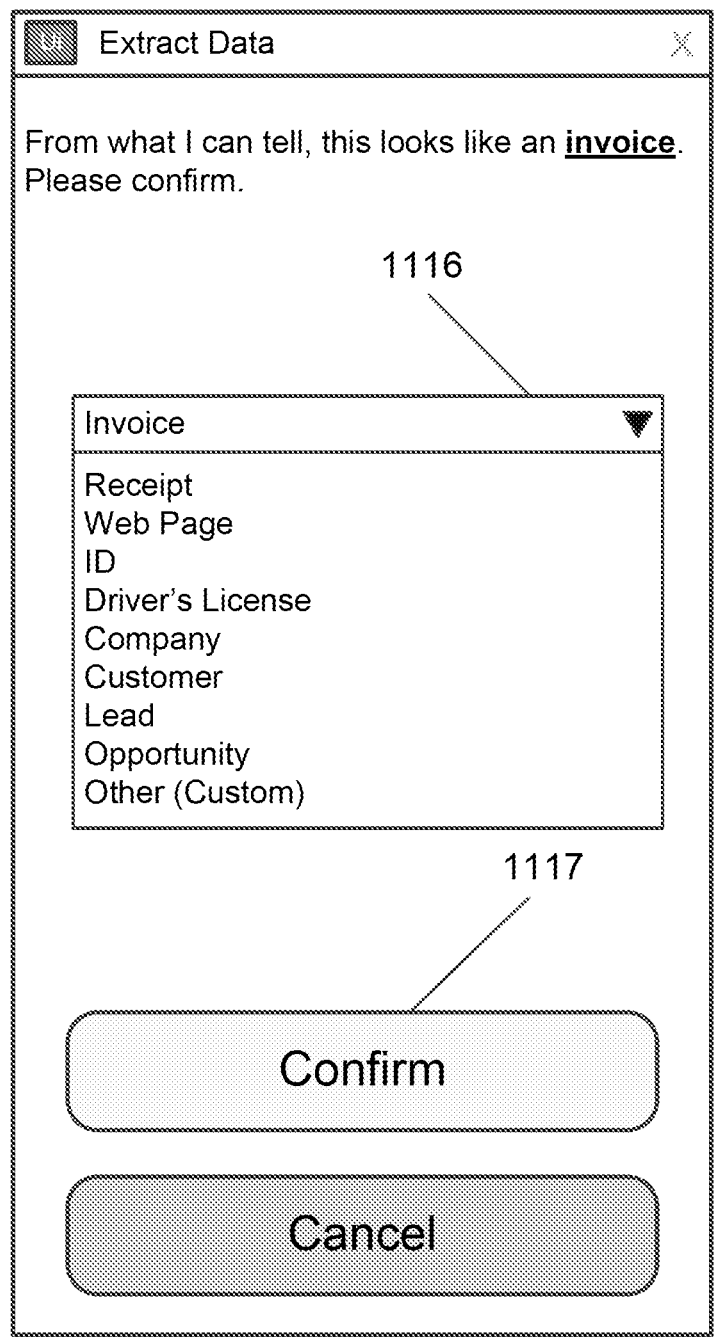
Figure 11E:
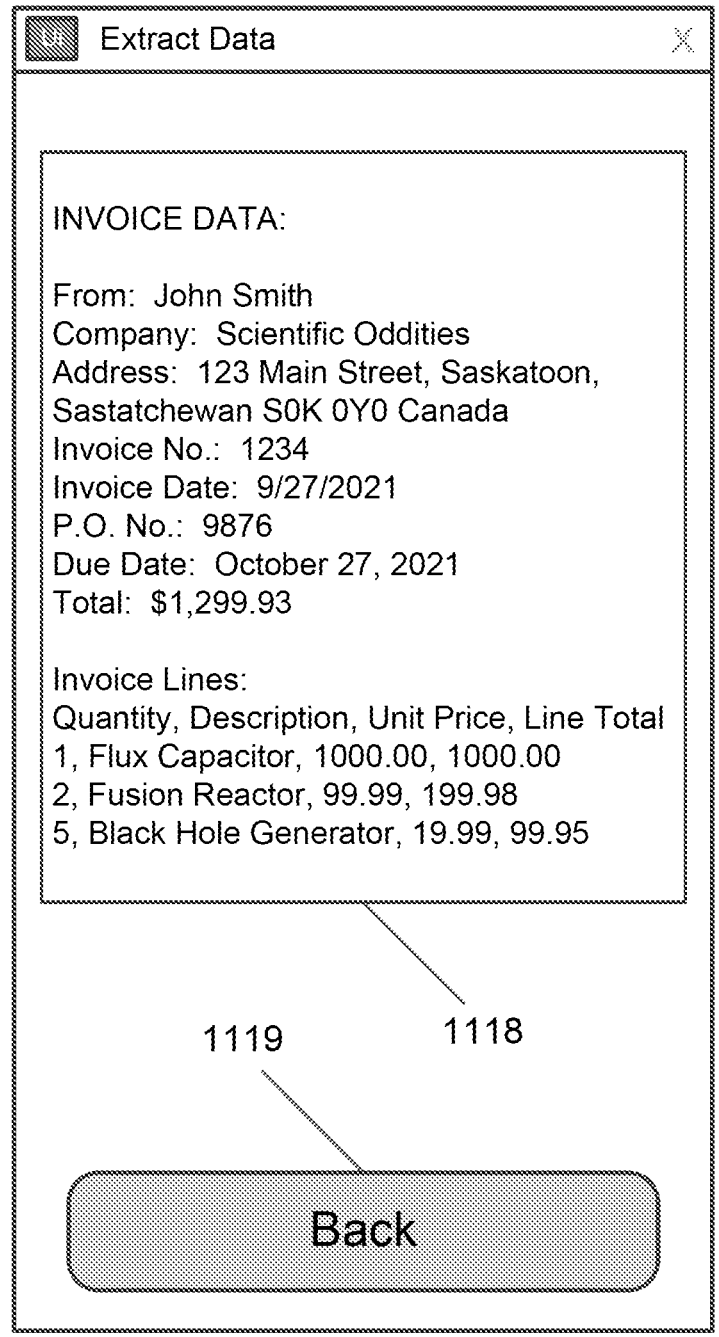

After indicating the application as the source (i.e., invoice 1113 in this example), the semantic automation logic (i.e., the semantic matching AI/ML models(s)) can predict the type of the source using a classification algorithm, and data extraction interface 1112 displays its prediction of the type of the source in dropdown menu 1116. See FIG. 11C. The user can confirm the prediction using confirm button 1117 or select another type from dropdown menu 1116. See FIG. 11D. A summary 1118 of the extracted data is then provided in data extraction interface 1112. See FIG. 11E. The user can then select back button 1119 to return to semantic copy and paste interface 1100 to perform data input.

Figure 11F:
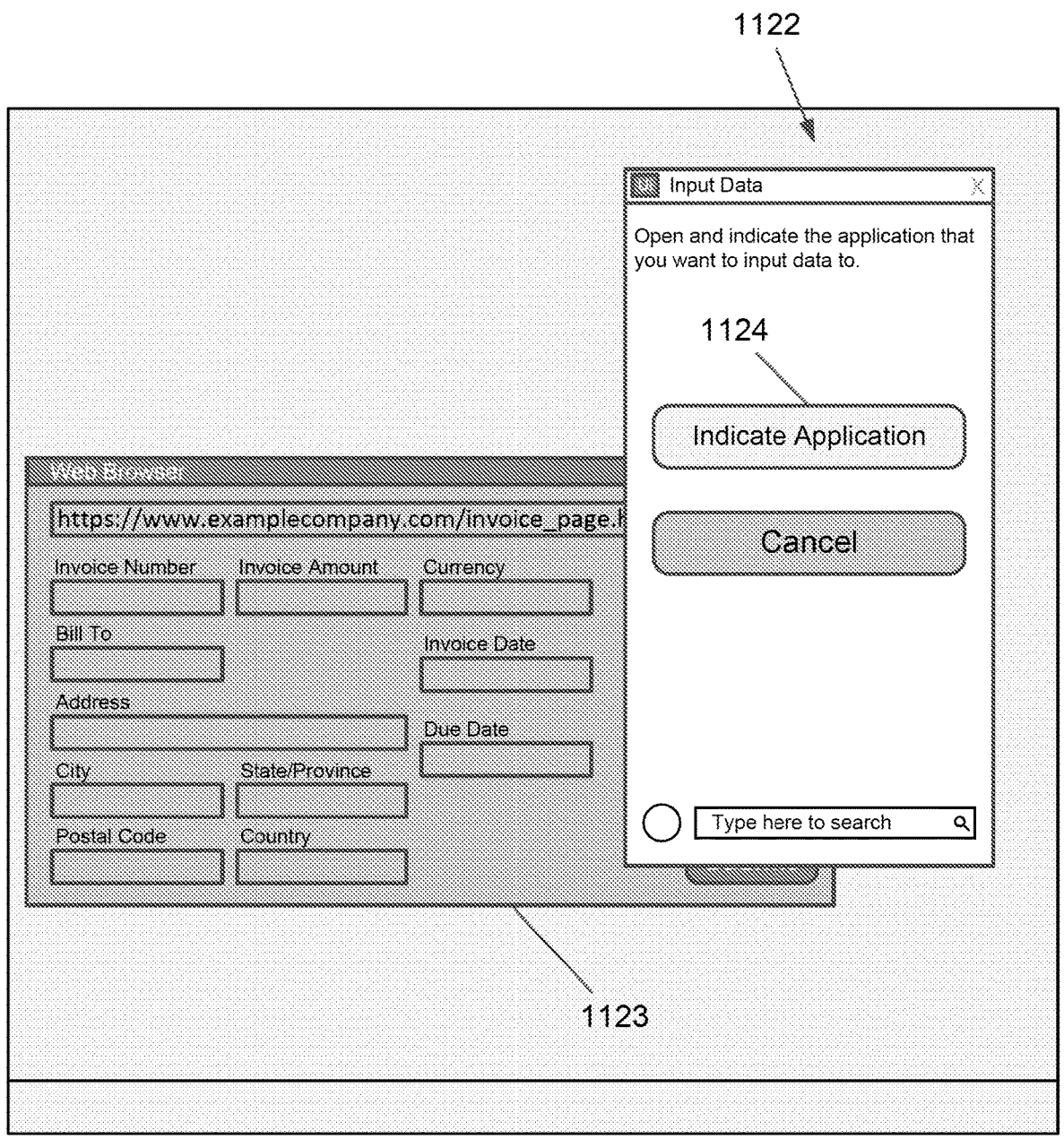

Upon selecting input data button 1120, the designer application asks the developer to open and indicate the application that he or she wants to extract data from via a data input interface 1122. See FIG. 11F. When the user clicks indicate application button 1124 of data input interface 1122, indicate on screen functionality is enabled. The user can then select a web invoice processing page 1123 as the target application.

Figure 11G:
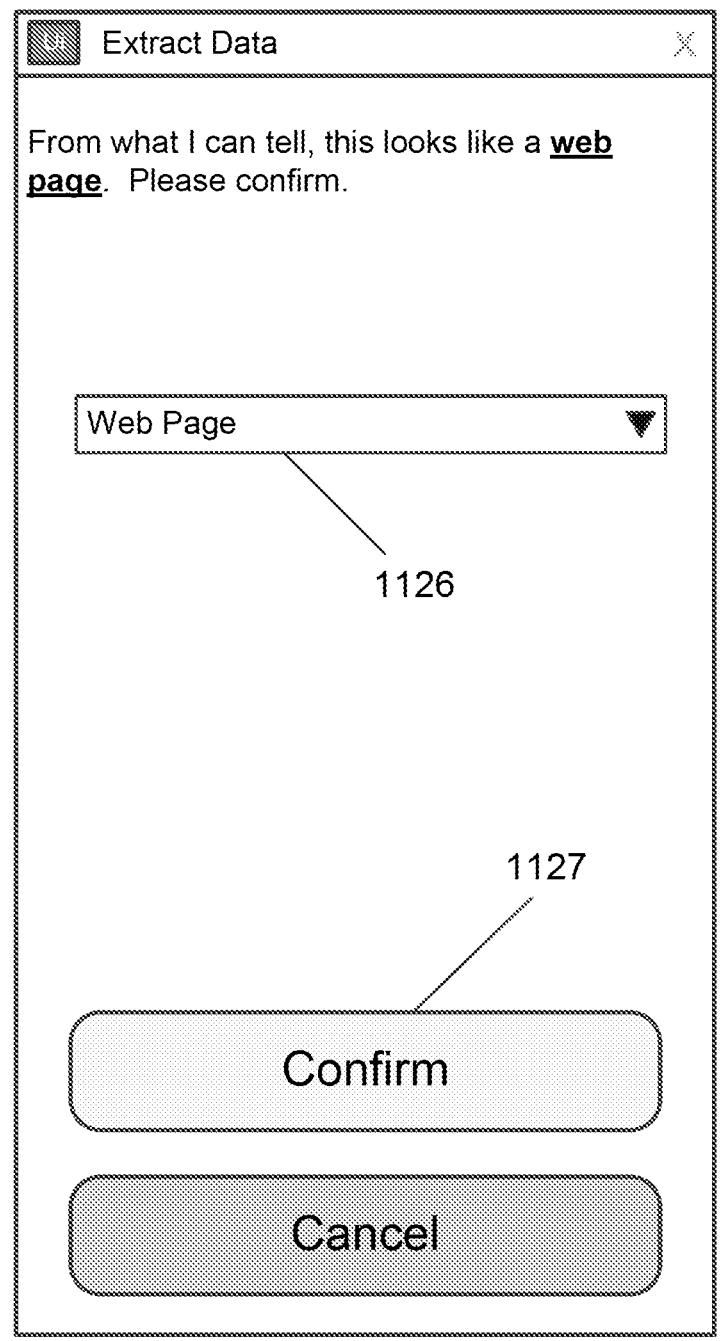
Figure 11H:
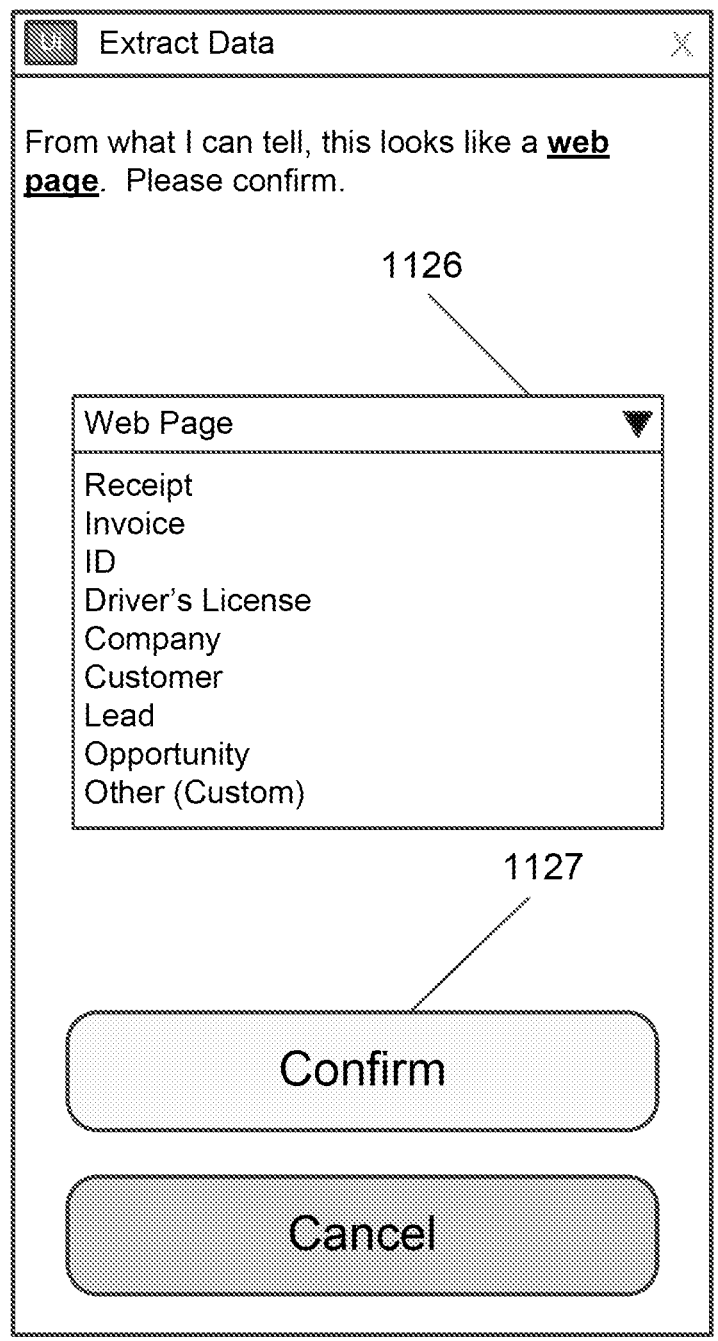

After indicating web invoice processing page 1123 as the target, the semantic automation logic can predict the type of the target using the classification algorithm, and data input interface 1122 displays its prediction of the type of the target in dropdown menu 1126. See FIG. 11G. The user can confirm the prediction using confirm button 1127 or select another type from dropdown menu 1126. See FIG. 11H. After confirmation by the user, the designer application automatically populates web browser 1123 using the extracted data. See FIG. 11I.

Figure 11J:
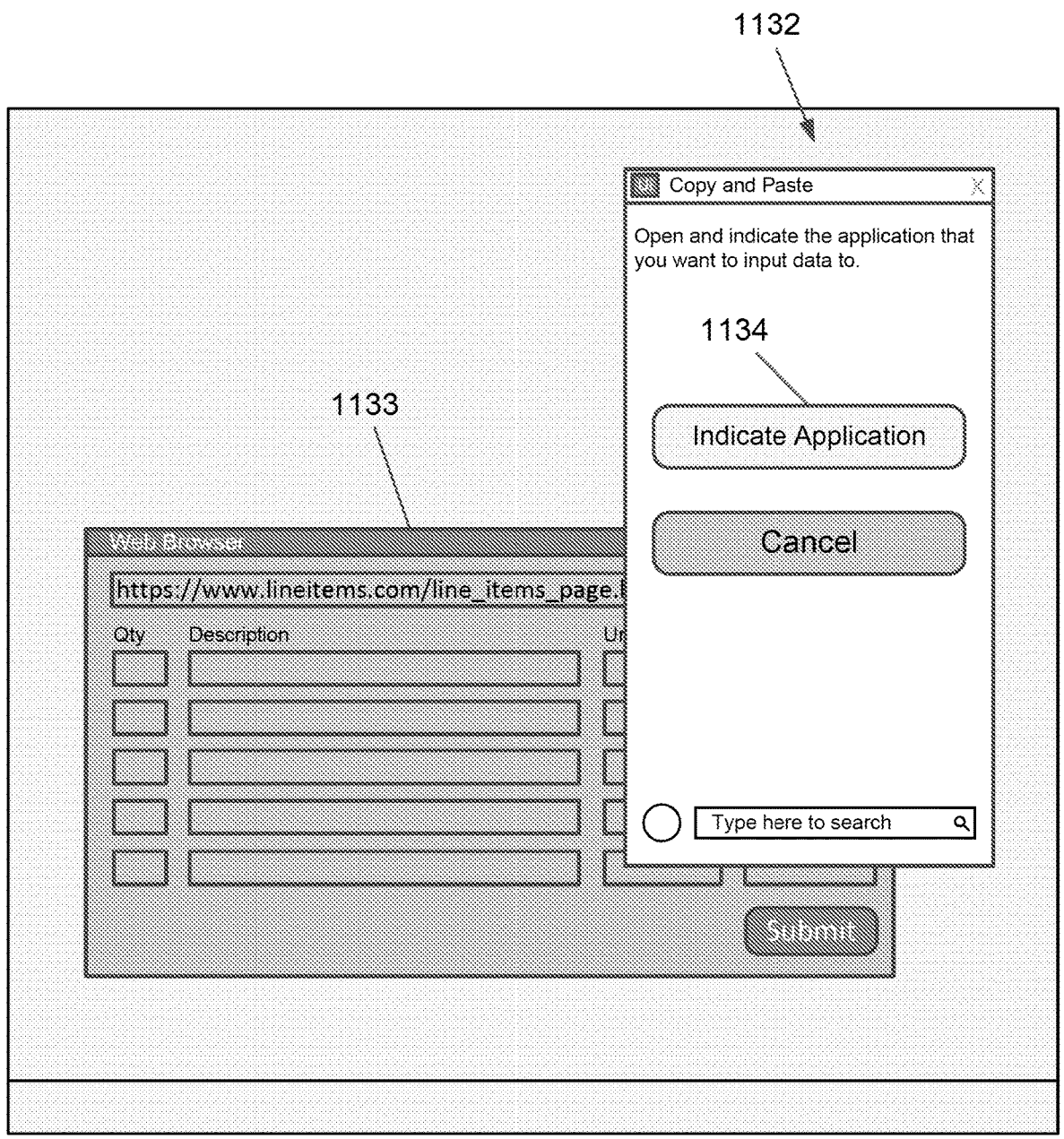

Users can also "copy and paste" data using copy and paste button 1130. Upon selecting copy and paste button 1130, the designer application asks the developer to open and indicate the application that he or she wants to input data into via a copy and paste interface 1132. See FIG. 11J. When the user clicks indicate application button 1134 of copy and paste interface 1132, indicate on screen functionality is enabled. The user can then select a line item entry page 1133 as the target application.

Figure 11K:
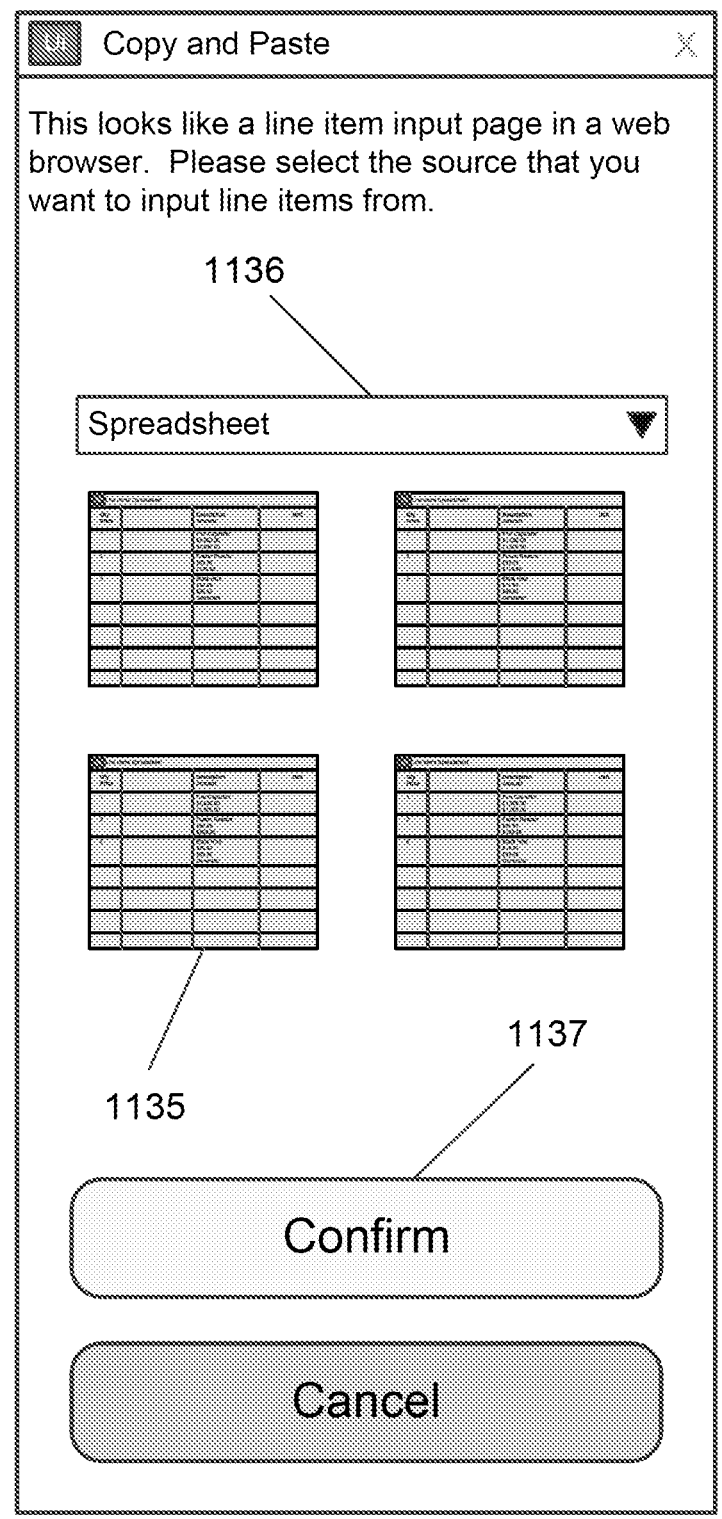
Figure 11L:
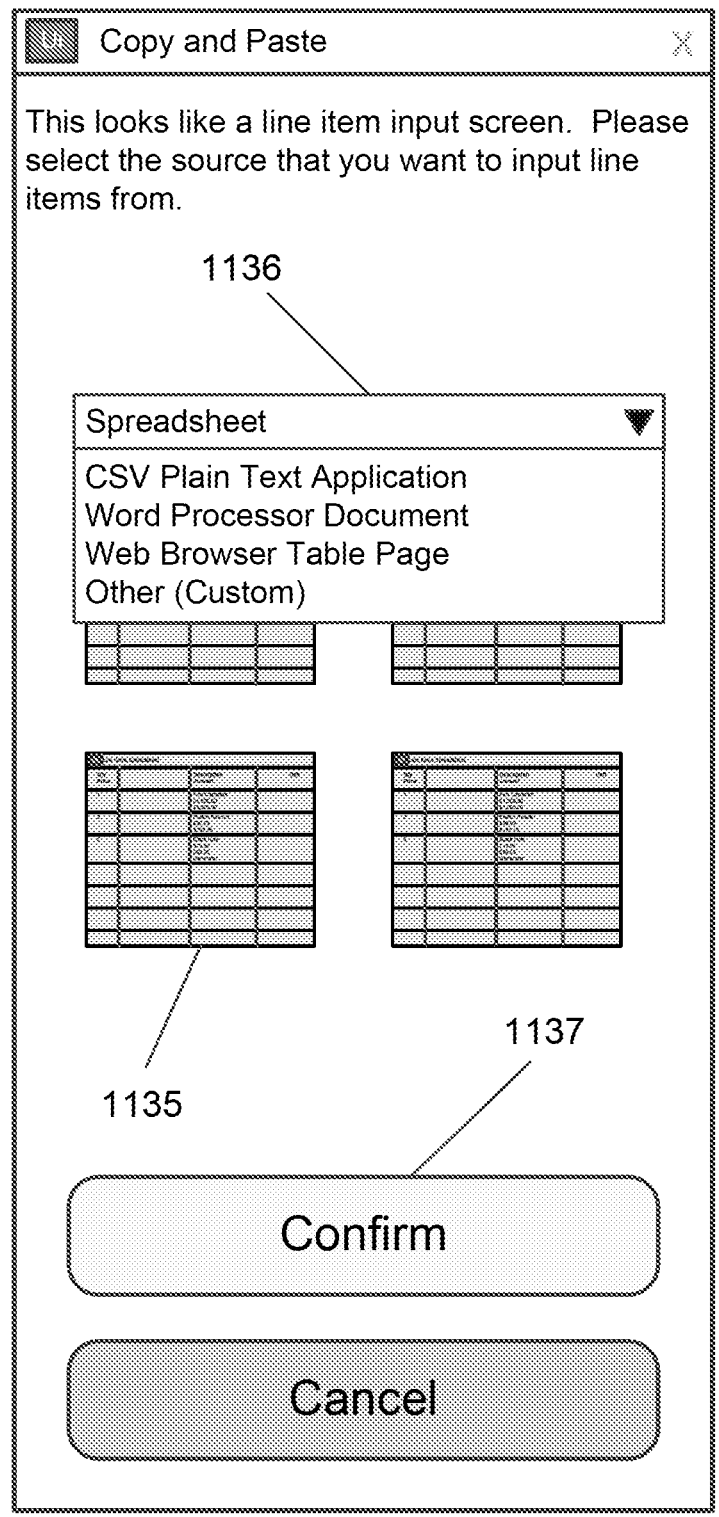
Figure 11M:
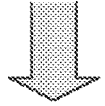

After indicating line item entry page 1133 as the target, the semantic automation logic can predict the type of the target using the classification algorithm, and copy and paste interface 1132 displays its prediction of the type of the target in dropdown menu 1136. See FIG. 11K. The user can confirm the prediction using confirm button 1137 or select another type from dropdown menu 1136. See FIG. 11L. The user can also select from a list of potential such as spreadsheet 1135. After confirmation by the user, the designer application automatically copies data from spreadsheet 1135 into line item entry page 1133. See FIG. 11M.

Figure 11N:
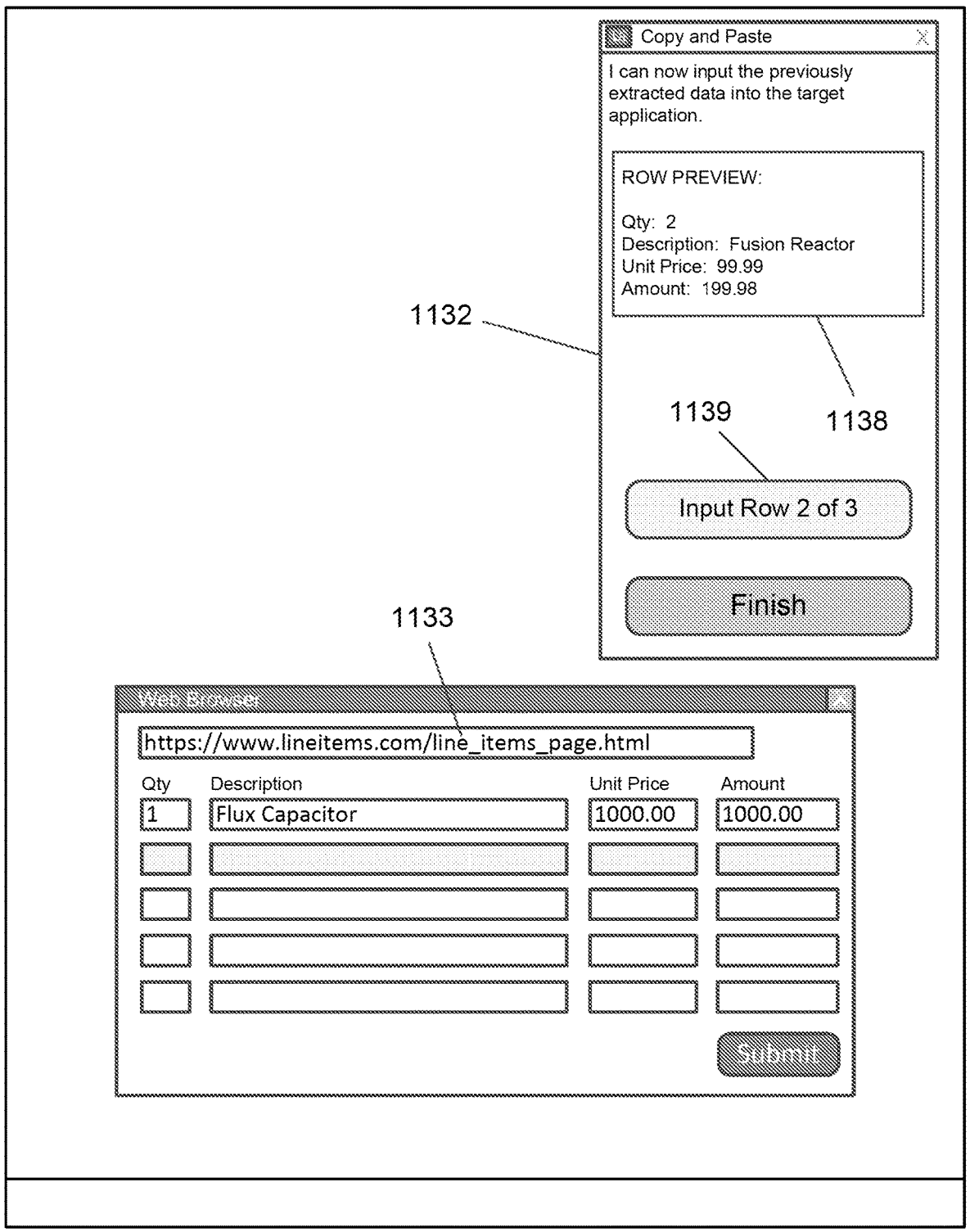

In some embodiments, the designer application, via copy and paste interface 1132, may prompt the user before entering a given line item into the target application. Such an example is shown in FIG. 11N, where the user reviews and approves each row before it is input into line item entry page 1133. Copy and paste interface 1132 shows a preview 1138 of the data that will be input from the next row of spreadsheet 1135. If the user clicks row confirmation button 1139, the designer application inputs the line shown in preview 1138 into the corresponding fields of line item entry page 1133.

FIG. 12 is an architectural diagram illustrating an architecture 1200 of the AI/ML models for performing semantic AI, according to an embodiment of the present invention. A CV model 1210 performs computer vision functionality to identify graphical elements in a screen and an OCR model 1220 performs text detection and recognition for the screen(s). In embodiments where both a source screen and a target screen are used, CV model 1210 and OCR model 1220 perform CV and OCR functionality on both screens.

CV model 1210 and OCR model 1220 then provide types, locations, sizes, text, etc. of the detected graphical elements and text in the target screen or both the target and source screen to a label matching model 1230 that matches labels from OCR model 1220 with graphical elements from CV model 1210. Matching labels and the associated graphical elements from the screen(s) are then passed to an input data matching model 1240, which matches input data from a data source or the source screen with labels of graphical elements in the target screen. The matches and the respective confidences are then provided as output from input data matching model 1240. In some embodiments, multiple AI/ML models may be used for input data matching that perform matching in different ways (e.g., they have different neural network architectures, employ different strategies, have been trained on different training data, etc.).

In some embodiments, the AI/ML model(s) may learn that fields with the same labels may have different context. For instance, both a billing information and a shipping information section of a screen may have an "Address" label, but the AI/ML model may learn that the pattern of the elements near one differs from those near the other. These sections of the screen may then be used as anchors in a multi-anchor technique where the text field is the target and the "Address" label and the section with the recognized pattern are the anchors. See, for example, U.S. Pat. No. 10,936,351 and U.S. patent application Ser. No. 17/100,146.

Figure 13:
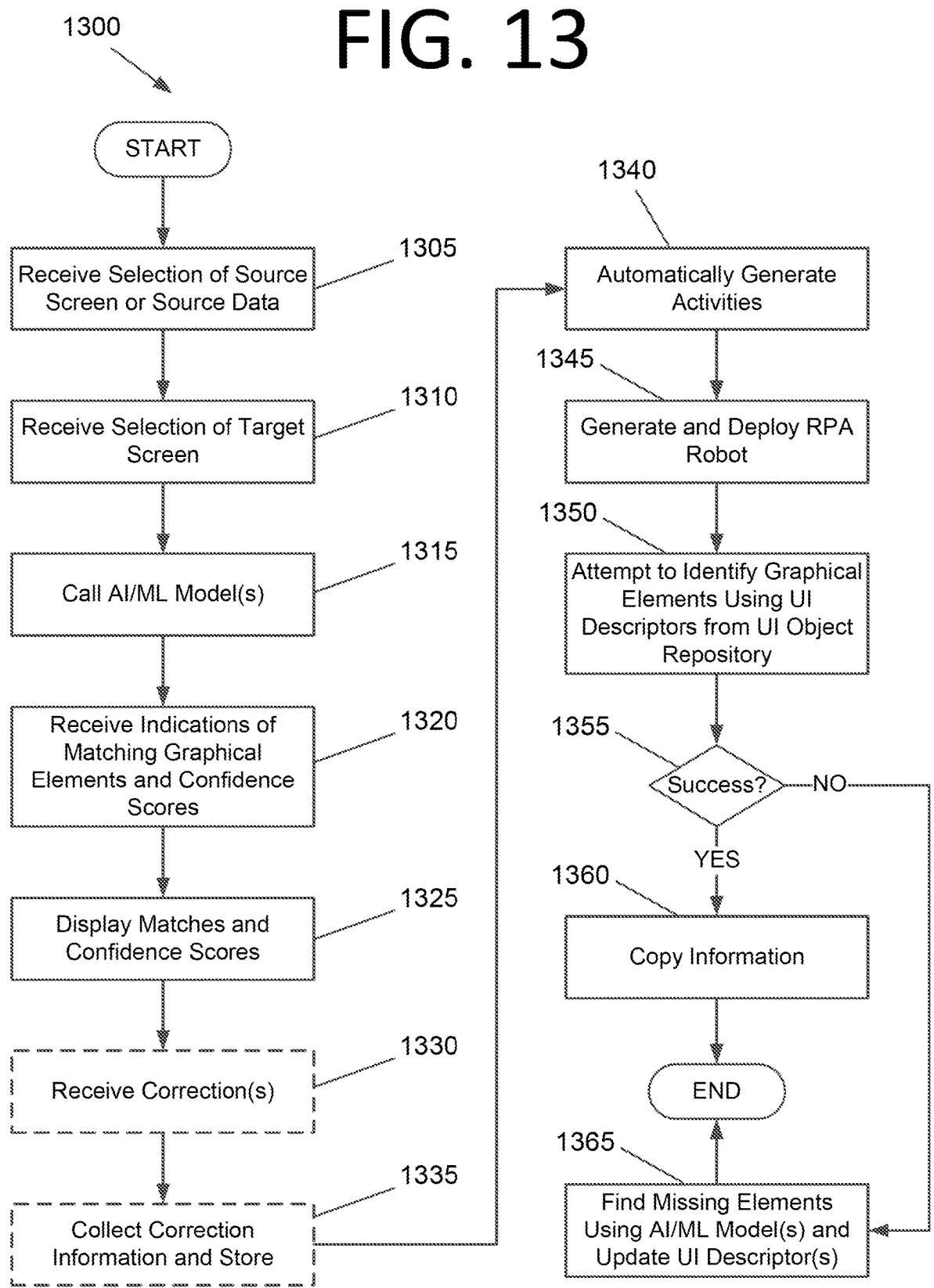
FIG. 13 is a flowchart illustrating a process for performing semantic matching between a source screen or source data and a target screen using semantic AI for RPA workflows, according to an embodiment of the present invention.

FIG. 13 is a flowchart illustrating a process 1300 for performing semantic matching between a source screen or source data and a target screen using semantic AI for RPA workflows, according to an embodiment of the present invention. The process begins with receiving a selection of a source screen or source data at 1305 and receiving a selection of a target screen at 1310. One or more AI/ML models that have been trained to perform semantic matching between labels in the source screen and labels in the target screen, between data elements in the source data and the labels in the target screen, or both, are then called at 1315. In some embodiments, the one or more AI/ML models are trained by providing words and phrases with semantic associations between the words and phrases such that similar words and phrases for a given word or phrase can be identified, and providing contextual labels pertaining to a screen in which the words and phrases appear. In some embodiments, the one or more AI/ML models include a CV model, an OCR model, a label matching model, and an input data matching model, where the label matching model matches labels detected by the OCR model with fields detected by the CV model and the input data model receives the matching labels from the label matching model and semantically matches the data elements from the data source or data from the fields associated with the labels from the source screen with the fields associated with the semantically matched labels on the target screen.

Indications of graphical elements associated with semantically matched labels in the target screen (e.g., locations, coordinates, type, etc.) and respective confidence scores from the one or more AI/ML models are received at 1320. The graphical elements associated with the semantically matched labels, individual confidence scores, and a global confidence score are displayed on the target screen in a matching interface at 1325. For instance, the target screen may be shown and matching elements may be highlighted or otherwise made obvious to the developer. In some embodiments, connections are drawing between matching fields in the source screen or source data and the target screen. In certain embodiments, elements in the source screen or source data for which no match was found are highlighted or otherwise indicated to the developer.

Correction(s) to a graphical element in the target screen identified by the one or more AI/ML models as having an associated semantically matching label, an indication of a new element in the target screen that was not semantically matched to a label in the source screen by the one or more AI/ML models, or both, are received at 1330. Information pertaining to the corrected and/or newly labeled graphical element(s) in the target screen and the associated label are collected and stored either directly (i.e., stored directly in computing system memory) or indirectly (i.e., sent to an external system for storage) at 1335. Steps 1330 and 1335 are performed if such corrections are provided by the developer.

One or more activities in an RPA workflow that copy data from the fields in the source screen having labels that the one or more AI/ML models identified as semantically matching the fields in the target screen, copy the data elements from the source data into the fields of the target screen having labels that the one or more AI/ML models identified as semantically matching the data elements from the source data, or both, are automatically generated at 1340. An RPA robot implementing the one or more generated activities in the RPA workflow is generated and deployed at 1345.

At runtime, the deployed RPA robot accesses UI descriptors for graphical elements it is trying to identify to perform the automation in accordance with the RPA workflow from a UI object repository and attempts to identify graphical elements in the target screen using these UI descriptors. If all target graphical elements can be identified at 1355, the information is copied from the source screen or data source to the target screen at 1360. However, if all graphical elements cannot be found at 1355, the RPA robot calls the AI/ML model(s) to attempt to identify the missing graphical element(s) and updates the UI descriptors for these respective graphical elements at 1365. For instance, the RPA robot may use the descriptor information provided by the AI/ML model(s) to update the respective UI descriptors for the missing elements in the UI object repository so other RPA robots will not encounter the same issue in the future. In this sense, the system is self-healing.

Figure 14:
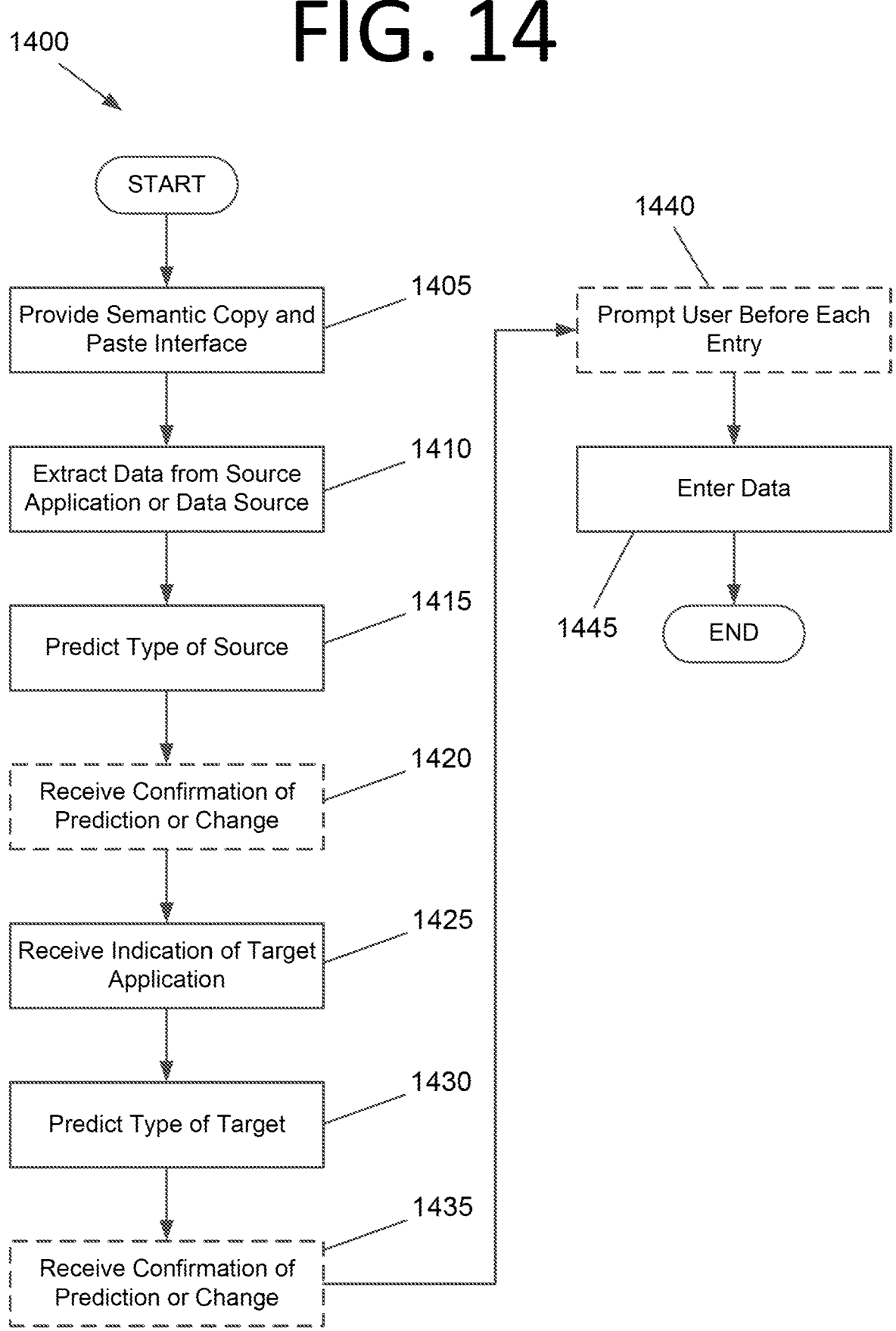
FIG. 14 is a flowchart illustrating a process for performing semantic matching between a source screen or source data and a target screen using semantic AI for using an attended automation interface, according to an embodiment of the present invention.

FIG. 14 is a flowchart illustrating a process 1400 for performing semantic matching between a source screen or source data and a target screen using semantic AI for using an attended automation interface, according to an embodiment of the present invention. The process begins with providing a semantic copy and paste interface at 1405. Data is extracted from a source application or a data source at 1410. The type of the source is predicted using a classification algorithm at 1415. In some embodiments, the semantic copy and paste application waits to receive confirmation of the prediction or a change to the prediction by a user at 1420.

An indication of the target application that the user wants to extract data into is received at 1425. The type of the target is predicted using a classification algorithm at 1430. In some embodiments, the semantic copy and paste application waits to receive confirmation of the prediction or a change to the prediction by a user at 1435.

In some embodiments, the user is prompted before each data entry at 1440. For instance, before entering a given data item (e.g., a line of data, an individual graphical element, etc.), the user may see the data to be input appear in the target application. The user may then preview and approve the entry or decline. Data from the source is then entered into the target application at 1445.

The process steps performed in FIGS. 13 and 14 may be performed by a computer program, encoding instructions for the processor(s) to perform at least part of the process(es) described in FIGS. 13 and 14, in accordance with embodiments of the present invention. The computer program may be embodied on a non-transitory computer-readable medium. The computer-readable medium may be, but is not limited to, a hard disk drive, a flash device, RAM, a tape, and/or any other such medium or combination of media used to store data. The computer program may include encoded instructions for controlling processor(s) of a computing system (e.g., processor(s) 510 of computing system 500 of FIG. 5) to implement all or part of the process steps described in FIGS. 13 and 14, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general purpose computer, an ASIC, or any other suitable device.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A non-transitory computer-readable medium storing a computer program, wherein the computer program is configured to cause at least one processor to:
display a semantic copy and paste interface;
receive a selection of a source screen or source data via the semantic copy and paste interface;
receive a selection of a target screen via the semantic copy and paste interface;
call one or more artificial intelligence/machine learning (AI/ML) models that have been trained to perform semantic matching between labels in the source screen and labels in the target screen, between data elements in the source data and the labels in the target screen, or both;
provide a confidence score of the individual matches via the semantic copy and paste interface, in response to the matching between labels, and
based on indications of graphical elements associated with semantically matched labels in the target screen and respective confidence scores from the one or more AI/ML models, automatically copy data from the fields in the source screen having labels that the one or more AI/ML models identified as semantically matching the fields in the target screen, automatically copy the data elements from the source data into the fields of the target screen having labels that the one or more AI/ML models identified as semantically matching the data elements from the source data, or both, via the semantic copy and paste interface, wherein
at least one of the graphical elements in the target screen differs from one or more graphical elements of the source screen and/or one or more data elements from the source data.

2. The non-transitory computer-readable medium of claim 1, wherein the semantic copy and paste interface is part of an RPA designer application.

3. The non-transitory computer-readable medium of claim 1, wherein the semantic copy and paste interface is a stand-alone application.

4. The non-transitory computer-readable medium of claim 1, wherein the semantic copy and paste interface is configured to provide data extraction functionality, data input functionality, copy and paste functionality, and extracted data display functionality.

5. The non-transitory computer-readable medium of claim 1, wherein the computer program is further configured to cause the at least one processor to:
prompt a user to indicate the source screen or source data to extract data from; and
facilitate the indication of the source screen or the source data via indicate on screen functionality.

6. The non-transitory computer-readable medium of claim 1, wherein the computer program is further configured to cause the at least one processor to:
prompt a user to indicate the target screen to copy data to; and
facilitate the indication of the target screen via indicate on screen functionality.

7. The non-transitory computer-readable medium of claim 1, wherein the computer program is further configured to cause the at least one processor to:
prompt a user before copying data associated with a label in the source screen or source data into the target screen;
receive an indication that the data associated with the label in the source screen or source data should be copied; and
copy the data associated with the label in the source screen or source data into the target screen.

8. The non-transitory computer-readable medium of claim 1, wherein the computer program is further configured to cause the at least one processor to:
generate one or more activities in a robotic process automation (RPA) workflow that copy data from the fields in the source screen having labels that the one or more AI/ML models identified as semantically matching the fields in the target screen, copy the data elements from the source data into the fields of the target screen having labels that the one or more AI/ML models identified as semantically matching the data elements from the source data, or both.

9. The non-transitory computer-readable medium of claim 8, wherein the computer program is further configured to cause the at least one processor to:
generate an automation implementing the one or more generated activities in the RPA workflow; and
deploy the generated automation in a runtime environment to be executed by an RPA robot.

10. The non-transitory computer-readable medium of claim 1, wherein the one or more AI/ML models are trained by providing words and phrases with semantic associations between the words and phrases such that similar words and phrases for a given word or phrase can be identified, and providing contextual labels pertaining to a screen in which the words and phrases appear.

11. The non-transitory computer-readable medium of claim 1, wherein
the one or more AI/ML models comprise a computer vision (CV) model, an optical character recognition (OCR) model, a label matching model, and an input data matching model,
the label matching model matches labels detected by the OCR model with fields detected by the CV model, and
the input data model receives the matching labels from the label matching model and semantically matches the data elements from the data source or data from the fields associated with the labels from the source screen with the fields associated with the semantically matched labels on the target screen.

12. A computer-implemented method, comprising:
displaying a semantic copy and paste interface, by an application executing on a computing system;
receiving a selection of a source screen or source data and a target screen via the semantic copy and paste interface, by the application;
calling one or more artificial intelligence/machine learning (AI/ML) models that have been trained to perform semantic matching between labels in the source screen and labels in the target screen, between data elements in the source data and the labels in the target screen, or both;

providing a confidence score of the individual matches via the semantic copy and paste interface, in response to the matching between labels; and based on output from the one or more AI/ML models, automatically copying data from the fields in the source screen having labels that the one or more AI/ML models identified as semantically matching the fields in the target screen, automatically copy the data elements from the source data into the fields of the target screen having labels that the one or more AI/ML models identified as semantically matching the data elements from the source data, or both, by the application, via the semantic copy and paste interface, wherein at least one of the graphical elements in the target screen differs from one or more graphical elements of the source screen and/or one or more data elements from the source data.

13. The computer-implemented method of claim 12, wherein the semantic copy and paste interface is configured to provide data extraction functionality, data input functionality, copy and paste functionality, and extracted data display functionality.

14. The computer-implemented method of claim 12, further comprising:
prompting a user to indicate the source screen or source data to extract data from, by the application; and
facilitating the indication of the source screen or the source data via indicate on screen functionality, by the application.

15. The computer-implemented method of claim 12, further comprising:
prompting a user to indicate the target screen to copy data to, by the computing system; and
facilitating the indication of the target screen via indicate on screen functionality, by the computing system.

16. The computer-implemented method of claim 12, further comprising:
prompting a user before copying data associated with a label in the source screen or source data into the target screen, by the computing system;
receiving an indication that the data associated with the label in the source screen or source data should be copied, by the computing system; and
copying the data associated with the label in the source screen or source data into the target screen, by the computing system.

17. The computer-implemented method of claim 12, further comprising:
generating one or more activities in a robotic process automation (RPA) workflow that copy data from the fields in the source screen having labels that the one or more AI/ML models identified as semantically matching the fields in the target screen, copy the data elements from the source data into the fields of the target screen having labels that the one or more AI/ML models identified as semantically matching the data elements from the source data, or both, by the application.

18. The computer-implemented method of claim 17, further comprising:
generating an automation implementing the one or more generated activities in the RPA workflow, by the application; and
deploying the generated automation in a runtime environment to be executed by an RPA robot, by the application.

19. The computer-implemented method of claim 12, wherein the one or more AI/ML models are trained by providing words and phrases with semantic associations between the words and phrases such that similar words and phrases for a given word or phrase can be identified, and providing contextual labels pertaining to a screen in which the words and phrases appear.

20. The computer-implemented method of claim 12, wherein
the one or more AI/ML models comprise a computer vision (CV) model, an optical character recognition (OCR) model, a label matching model, and an input data matching model,
the label matching model matches labels detected by the OCR model with fields detected by the CV model, and
the input data model receives the matching labels from the label matching model and semantically matches the data elements from the data source or data from the fields associated with the labels from the source screen with the fields associated with the semantically matched labels on the target screen.

21. A computing system, comprising:
memory storing computer program instructions; and
at least one processor configured to execute the computer program instructions, wherein the computer program instructions are further configured to cause the at least one processor to:
receive a selection of a source screen or source data and a target screen via a semantic copy and paste interface;
call one or more artificial intelligence/machine learning (AI/ML) models that have been trained to perform semantic matching between labels in the source screen and labels in the target screen, between data elements in the source data and the labels in the target screen, or both;
provide a confidence of the individual matches via the semantic copy and paste interface, in response to the matching between labels; and
based on indications of graphical elements associated with semantically matched labels in the target screen and respective confidence scores from the one or more AI/ML models, automatically copy data from the fields in the source screen having labels that the one or more AI/ML models identified as semantically matching the fields in the target screen, automatically copy the data elements from the source data into the fields of the target screen having labels that the one or more AI/ML models identified as semantically matching the data elements from the source data, or both, via the semantic copy and paste interface, wherein
the semantic copy and paste interface is configured to provide data extraction functionality, data input functionality, copy and paste functionality, and extracted data display functionality, and
at least one of the graphical elements in the target screen differs from one or more graphical elements of the source screen and/or one or more data elements from the source data.

22. The computing system of claim 21, wherein the computer program instructions are further configured to cause the at least one processor to:
prompt a user to indicate the source screen or source data to extract data from; and
facilitate the indication of the source screen or the source data via indicate on screen functionality.

23. The computing system of claim 21, wherein the computer program instructions are further configured to cause the at least one processor to:
prompt a user to indicate the target screen to copy data to; and
facilitate the indication of the target screen via indicate on screen functionality.

24. The computing system of claim 21, wherein the computer program instructions are further configured to cause the at least one processor to:
prompt a user before copying data associated with a label in the source screen or source data into the target screen;
receive an indication that the data associated with the label in the source screen or source data should be copied; and
copy the data associated with the label in the source screen or source data into the target screen.

25. The computing system of claim 21, wherein the computer program instructions are further configured to cause the at least one processor to:
generate one or more activities in a robotic process automation (RPA) workflow that copy data from the fields in the source screen having labels that the one or more AI/ML models identified as semantically matching the fields in the target screen, copy the data elements from the source data into the fields of the target screen having labels that the one or more AI/ML models identified as semantically matching the data elements from the source data, or both.

26. The computing system of claim 25, wherein the computer program instructions are further configured to cause the at least one processor to:
generate an automation implementing the one or more generated activities in the RPA workflow; and
deploy the generated automation in a runtime environment to be executed by an RPA robot.

27. The computing system of claim 21, wherein the one or more AI/ML models are trained by providing words and phrases with semantic associations between the words and phrases such that similar words and phrases for a given word or phrase can be identified, and providing contextual labels pertaining to a screen in which the words and phrases appear.

28. The computing system of claim 21, wherein
the one or more AI/ML models comprise a computer vision (CV) model, an optical character recognition (OCR) model, a label matching model, and an input data matching model,
the label matching model matches labels detected by the OCR model with fields detected by the CV model, and
the input data model receives the matching labels from the label matching model and semantically matches the data elements from the data source or data from the fields associated with the labels from the source screen with the fields associated with the semantically matched labels on the target screen.

* * * * *